(12) United States Patent
McAllister et al.

(10) Patent No.: US 11,286,407 B2
(45) Date of Patent: Mar. 29, 2022

(54) PRESSURE-SENSITIVE ADHESIVE COMPOSITIONS FOR MANUFACTURING ELECTRONIC DEVICES

(71) Applicant: 3M INNOVATIVE PROPERTIES COMPANY, St. Paul, MN (US)

(72) Inventors: John W. McAllister, St. Paul, MN (US); Jingjing Ma, Cottage Grove, MN (US); Zhong Chen, Woodbury, MN (US); Pierre R. Bieber, Duesseldorf (DE); Petra M. Stegmaier, Duesseldorf (DE); Eike H. Klünker, Kaarst (DE)

(73) Assignee: 3M Innovative Properties Company, St. Paul, MN (US)

( * ) Notice: Subject to any disclaimer, the term of this patent is extended or adjusted under 35 U.S.C. 154(b) by 451 days.

(21) Appl. No.: 16/471,595

(22) PCT Filed: Dec. 20, 2017

(86) PCT No.: PCT/IB2017/058212
§ 371 (c)(1),
(2) Date: Jun. 20, 2019

(87) PCT Pub. No.: WO2018/116205
PCT Pub. Date: Jun. 28, 2018

(65) Prior Publication Data
US 2021/0130661 A1    May 6, 2021

(30) Foreign Application Priority Data
Dec. 22, 2016    (EP) ..................... 16206228

(51) Int. Cl.
| H01L 29/08 | (2006.01) |
| C09J 11/08 | (2006.01) |
| C09J 7/28 | (2018.01) |
| H01L 27/32 | (2006.01) |
| H01L 51/52 | (2006.01) |
| H01L 51/56 | (2006.01) |

(52) U.S. Cl.
CPC ............. *C09J 11/08* (2013.01); *C09J 7/28* (2018.01); *H01L 27/323* (2013.01); *H01L 51/5253* (2013.01); *H01L 51/56* (2013.01); *C09J 2203/326* (2013.01); *C09J 2409/00* (2013.01); *C09J 2453/00* (2013.01)

(58) Field of Classification Search
CPC ........................................................ C09J 11/08
See application file for complete search history.

(56) References Cited

U.S. PATENT DOCUMENTS

| 5,296,547 | A |  | 3/1994 | Nestegard |
| 5,393,787 | A |  | 2/1995 | Nestegard |
| 5,602,221 | A |  | 2/1997 | Bennett |
| 5,605,964 | A |  | 2/1997 | Groves |
| 5,677,376 | A |  | 10/1997 | Groves |
| 7,163,741 | B2 |  | 1/2007 | Khandpur |
| 8,680,759 | B2 | * | 3/2014 | Anami ................ H01L 51/5246 313/498 |
| 9,543,549 | B2 | * | 1/2017 | Bai ............................ C09J 7/10 |
| 9,837,569 | B2 | * | 12/2017 | Rasal ................. H01L 31/0481 |
| 9,865,842 | B2 | * | 1/2018 | Song .................... H01L 51/525 |
| 2008/0213579 | A1 |  | 9/2008 | Lee |
| 2010/0148127 | A1 | * | 6/2010 | Ellinger ............... C09J 123/142 252/500 |
| 2012/0214936 | A1 |  | 8/2012 | Fujita |
| 2013/0251990 | A1 |  | 8/2013 | Higashi |
| 2014/0037952 | A1 |  | 2/2014 | Shigetomi |

(Continued)

FOREIGN PATENT DOCUMENTS

| EP | 3020773 | 5/2016 |
| WO | WO 2016-077132 | 5/2016 |
| WO | WO 2017-196560 | 11/2017 |

OTHER PUBLICATIONS

Handbook of Polymer Foams, edited by David Eaves, published by Shawbury, Shrewsbury, Shropshire, UK: Rapra Technology, 2004, 10 pages.
Pocius, Adhesion and Adhesives Technology: An Introduction, 2nd Ed., Hanser Gardner Publication, Cincinnati, OH, 2002.
Extended EP Search Report for EP Application No. 16206228.5, dated Jun. 8, 2017, 6 pages.
International Search Report for PCT International Application No. PCT/IB2017/058212, dated Mar. 13, 2018, 4 pages.

* cited by examiner

*Primary Examiner* — Caleb E Henry

(57) ABSTRACT

The present disclosure relates to an electronic device comprising at least one organic light-emitting diode and a pressure sensitive adhesive composition comprising a synthetic rubber block (co)polymer, and wherein the pressure sensitive adhesive composition has: a) a relative permittivity no greater than 2.50, when measured at an alternating current frequency of 100 kHz according to the test method described in the experimental section; b) a water uptake no greater than 0.60 wt %, when measured after exposure to 60° C. and 95% relative humidity for 120 hours, according to the test method described in the experimental section; and c) optionally, a peel adhesion value above 0.20 N/mm, when measured at 85° C. according to the test method described in the experimental section. In another aspect, the present disclosure is directed to a method of manufacturing an electronic device comprising at least one organic light-emitting diode, wherein the method comprises the step of using a pressure sensitive adhesive composition as described above. According to still another aspect, the present disclosure is directed to the use of a pressure sensitive adhesive composition as described above for protecting organic light-emitting devices or organic light-emitting diodes from moisture and air permeation.

14 Claims, No Drawings

(56) References Cited

U.S. PATENT DOCUMENTS

2014/0272201 A1 9/2014 Takeda
2015/0099081 A1* 4/2015 Bai .................. C09J 7/403
　　　　　　　　　　　　　　　　　　　428/41.1

PRESSURE-SENSITIVE ADHESIVE COMPOSITIONS FOR MANUFACTURING ELECTRONIC DEVICES

CROSS REFERENCE TO RELATED APPLICATIONS

This application is a national stage filing under 35 U.S.C. 371 of PCT/IB2017/058212, filed Dec. 20, 2017, which claims the benefit of EP Application No. 16206228.5, filed Dec. 22, 2016, the disclosure of which is incorporated by reference in their entirety herein.

TECHNICAL FIELD

The present disclosure relates generally to the field of pressure sensitive adhesives (PSA), more specifically to the field of rubber-based pressure sensitive adhesives for use in the manufacturing of electronic devices. The present disclosure also relates to a method of manufacturing electronic devices.

BACKGROUND

Adhesives have been used for a variety of marking, holding, protecting, sealing and masking purposes. Adhesive tapes generally comprise a backing, or substrate, and an adhesive. One type of adhesive which is particularly preferred for many applications is represented by pressure sensitive adhesives.

Pressure-sensitive tapes are virtually ubiquitous in the home and workplace. In its simplest configuration, a pressure-sensitive tape comprises an adhesive and a backing, and the overall construction is tacky at the use temperature and adheres to a variety of substrates using only moderate pressure to form the bond. In this fashion, pressure-sensitive tapes constitute a complete, self-contained bonding system.

Pressure sensitive adhesives (PSAs) are well known to one of ordinary skill in the art, and according to the Pressure-Sensitive Tape Council, PSAs are known to possess properties including the following: (1) aggressive and permanent tack, (2) adherence with no more than finger pressure, (3) sufficient ability to hold onto an adherend, and (4) sufficient cohesive strength. Materials that have been found to function well as PSAs include polymers designed and formulated to exhibit the requisite viscoelastic properties resulting in a desired balance of tack, peel adhesion, and shear holding power. PSAs are characterized by being normally tacky at room temperature (e.g., 20° C.). PSAs do not embrace compositions merely because they are sticky or adhere to a surface.

These requirements are assessed generally by means of tests which are designed to individually measure tack, adhesion (peel strength), and cohesion (shear holding power), as noted in A. V. Pocius in Adhesion and Adhesives Technology: An Introduction, $2^{nd}$ Ed., Hanser Gardner Publication, Cincinnati, Ohio, 2002. These measurements taken together constitute the balance of properties often used to characterize a PSA.

With broadened use of pressure-sensitive tapes over the years, performance requirements have become more demanding. Shear holding capability, for example, which originally was intended for applications supporting modest loads at room temperature, has now increased substantially for many applications in terms of operating temperature and load. Similarly, an increased need has arisen for pressure sensitive adhesives having improved and versatile adhesion characteristics; in particular with respect to peel forces and shear resistance on various types of difficult to adhere surfaces, such as in particular the so-called low surface energy (LSE) and medium surface energy (MSE) substrates.

In addition to increasing performance requirements with regard to pressure sensitive adhesives, volatile organic compounds (VOC) reduction regulations are becoming increasingly important in particular for various kind of interior applications (occupational hygiene and occupational safety) such as e.g. in the construction market or in the automotive or electronics industries. Known acrylate-based pressure sensitive adhesives typically contain notable amounts of low molecular weight organic residuals, such as un-reacted monomers arising from their polymerization process, polymerization initiator residuals, contaminations from raw materials or degradation products formed during the manufacturing process. These low molecular weight residuals qualifying as VOC may diffuse out of the adhesive tape and can be potentially harmful.

In that context, the so-called optically clear pressure sensitive adhesive films (OCA) based on polyacrylates have recently emerged as the most commonly used technical solution for laminating optical members for use in the manufacturing of electronic devices, including organic light-emitting devices. Exemplary optically clear adhesive films are described e.g. in US-A1-2012/0214936 (Fujita et al.), in US-A1-2013/0251990 (Higashi et al.), in US-A1-2014/0037952 (Shigetomi et al.), and in US-A1-2014/0272201 (Takeda et al.). However, as described in US-A1-2008/0213579 (Lee et al.), the use of polyacrylate-based adhesive formulations is not always ideal, in particular for the manufacturing of organic light-emitting devices where the moisture and oxygen barrier requirements are the most demanding. Moreover, acrylic based adhesive formulations have been shown to be inadequate in reaching low relative permittivity (also referred to as dielectric constant), which is important in the manufacture of electronic devices.

Without contesting the technical advantages associated with the pressure sensitive adhesives known in the art, there is still a need for a stable and cost-effective pressure sensitive adhesive composition providing low relative permittivity and low sensitivity to moisture, and which is particularly suitable for the manufacturing of electronic devices. Other advantages of the pressure sensitive adhesives, assemblies and methods of the disclosure will be apparent from the following description.

SUMMARY

According to one aspect, the present disclosure relates to an electronic device comprising at least one organic light-emitting diode and a pressure sensitive adhesive composition comprising a synthetic rubber block (co)polymer, and wherein the pressure sensitive adhesive composition has:
a) a relative permittivity no greater than 2.50, when measured at an alternating current frequency of 100 kHz according to the test method described in the experimental section;
b) a water uptake no greater than 0.60 wt %, when measured after exposure to 60° C. and 95% relative humidity for 120 hours, according to the test method described in the experimental section; and
c) optionally, a peel adhesion value above 0.20 N/mm, when measured at 85° C. according to the test method described in the experimental section.

In another aspect, the present disclosure is directed to a method of manufacturing an electronic device comprising at least one organic light-emitting diode, wherein the method comprises the step of using a pressure sensitive adhesive composition as described above.

According to still another aspect, the present disclosure is directed to the use of a pressure sensitive adhesive composition as described above for protecting organic light-emitting devices or organic light-emitting diodes from moisture and air permeation.

DETAILED DESCRIPTION

According to first aspect, the present disclosure relates to an electronic device comprising at least one organic light-emitting diode and a pressure sensitive adhesive composition comprising a synthetic rubber block (co)polymer, and wherein the pressure sensitive adhesive composition has:
 a) a relative permittivity no greater than 2.50, when measured at an alternating current frequency of 100 kHz according to the test method described in the experimental section;
 b) a water uptake no greater than 0.60 wt %, when measured after exposure to 60° C. and 95% relative humidity for 120 hours, according to the test method described in the experimental section; and
 c) optionally, a peel adhesion value above 0.20 N/mm, when measured at 85° C. according to the test method described in the experimental section.

In the context of the present disclosure, it has been surprisingly found that a pressure sensitive adhesive composition as described above is outstandingly suitable for the manufacture of electronic devices comprising at least one organic light-emitting diode. The pressure sensitive adhesive composition as described herein has been found to serve a dual purpose: providing adequate adhesion between the various electronic device components, and acting as a non-conductive layer in which the low relative permittivity of the adhesive composition prevents electrical charge buildup between the components of the electronic device. Moreover, it has been no less surprisingly been found that the pressure sensitive adhesive composition as described herein is uniquely suited for encapsulating and/or protecting organic light-emitting devices or organic light-emitting diodes from moisture and air permeation. Advantageously still, the pressure sensitive adhesive composition as described herein provides excellent corrosion resistance when applied to typical electronic device components, in particular electrically conductive metals such as copper, gold, silver or aluminum, even after prolonged exposure of such materials at 65° C. and 90% relative humidity for more than 500 hours.

In some aspects of the present disclosure, the pressure sensitive adhesive composition for use herein is able to provide and maintain excellent and versatile adhesion characteristics between the various electronic device components even at elevated temperatures (up to 85° C.), with respect to various types of substrate, including the so-called LSE and MSE substrates. In some other aspects of the present disclosure, the pressure sensitive adhesive composition for use herein is characterized by reduced overall VOC level characteristics. In some advantageous aspects still, the pressure sensitive adhesive compositions as described herein are characterized by very low or even substantial absence of perceptible odor.

In the context of the present disclosure, the expression "low surface energy substrates" is meant to refer to those substrates having a surface energy of less than 34 dynes per centimeter. Included among such materials are polypropylene, polyethylene (e.g., high density polyethylene or HDPE, low density polyethylene or LDPE, LLDPE), and blends of polypropylene (e.g. PP/EPDM, TPO).

In the context of the present disclosure, the expression "medium surface energy substrates" is meant to refer to those substrates having a surface energy comprised between 34 and 70 dynes per centimeter, typically between 34 and 60 dynes per centimeter, and more typically between 34 and 50 dynes per centimeter. Included among such materials are polyamide 6 (PA6), acrylonitrile butadiene styrene (ABS), PC/ABS blends, PC, PVC, PA, polyurethanes, PUR, TPE, POM, polystyrene, poly(methyl methacrylate) (PMMA), clear coat surfaces, in particular clear coats for vehicles like a car or coated surfaces for industrial applications and composite materials like fibre reinforced plastics.

The surface energy is typically determined from contact angle measurements as described, for example, in ASTM D7490-08.

The electronic device according to the present disclosure comprises at least one organic light-emitting diode and a pressure sensitive adhesive composition comprising a synthetic rubber block (co)polymer.

Any synthetic rubber block (co)polymers typically known by those skilled in the art may be used in the context of the present disclosure as long as they fulfill the above-mentioned relative permittivity, water uptake, and optionally peel adhesion requirement. Suitable synthetic rubber block (co)polymers for use herein may be easily identified by those skilled, in the light of the present disclosure. Typical examples of synthetic rubber block (co)polymers that can be used herein include, but are not limited to, styrenic block (co)polymers.

According to a beneficial aspect of the present disclosure, the styrenic block (co)polymer is selected from the group consisting of styrene-isoprene block copolymers, styrene-butadiene block copolymers, and any combinations or mixtures thereof. According to another beneficial aspect of the present disclosure, the styrenic block (co)polymer is selected from the group consisting of styrene-isoprene-styrene block copolymers, styrene-butadiene-styrene block copolymers, styrene-ethylene-butadiene-styrene block copolymers, styrene-ethylene-propylene-styrene block copolymers, and any combinations or mixtures thereof. In a more advantageous aspect of the pressure sensitive adhesive composition for use herein, the styrenic block (co)polymer is selected from the group consisting styrene-isoprene-styrene block copolymers, styrene-butadiene-styrene block copolymers, and any combinations or mixtures thereof. Preferably, the styrenic block (co)polymer is selected from the group of styrene-isoprene-styrene block copolymers.

According to a typical aspect of the present disclosure, the pressure sensitive adhesive composition for use herein comprises at least 20 wt %, at least 25 wt %, at least 30 wt %, at least 35 wt %, or even at least 40 wt % of synthetic rubber block (co)polymer(s), based on the weight of the pressure sensitive adhesive composition.

According to an advantageous aspect of the electronic device according to present disclosure, the pressure sensitive adhesive composition for use herein has a relative permittivity no greater than 2.45, no greater than 2.40, no greater than 2.35, no greater than 2.30, when measured at an alternating current frequency of 100 kHz according to the test method described in the experimental section.

According to a more advantageous aspect of the electronic device, the pressure sensitive adhesive composition for use herein has a relative permittivity no greater than 2.50, no greater than 2.45, or even no greater than 2.40, when measured at an alternating current frequency of 100 kHz after exposure to 65° C. and 90% relative humidity for 72 hours, according to the test method described in the experimental section.

According to an even more advantageous aspect of the electronic device, the pressure sensitive adhesive composition for use herein has a relative permittivity no greater than 2.50, no greater than 2.45, or even no greater than 2.40, when measured at an alternating current frequency of 100 kHz after exposure to 65° C. and 90% relative humidity for 500 hours, according to the test method described in the experimental section.

According to the present disclosure, the pressure sensitive adhesive composition for use herein is provided with excellent resistance to moisture, even after prolonged exposure to high temperature and high relative humidity. This property makes the resulting pressure sensitive adhesive composition outstandingly suitable to withstand the relatively elevated temperatures, and optionally high humidity conditions which may be typically experienced in modern electronic devices, in particular OLED-based electronic devices.

In an advantageous aspect of the electronic device according to the present disclosure, the pressure sensitive adhesive composition for use herein has a water uptake no greater than 0.55 wt %, no greater than 0.50 wt %, no greater than 0.45 wt %, no greater than 0.40 wt %, no greater than 0.35 wt %, no greater than 0.30 wt %, no greater than 0.25 wt %, no greater than 0.20 wt %, or even no greater than 0.15 wt %, when measured after exposure to 60° C. and 95% relative humidity for 120 hours, according to the test method described in the experimental section.

According to an advantageous aspect of the electronic device, the pressure sensitive adhesive composition for use herein is able to provide and maintain excellent and versatile adhesion characteristics, in particular peel strength, at elevated temperatures (up to 85° C.), with respect to various types of substrate, including the so-called LSE and MSE substrates.

In a beneficial aspect of the electronic device according to the present disclosure, the pressure sensitive adhesive composition for use herein has a peel adhesion value above 0.25 N/mm, above 0.30 N/mm, above 0.35 N/mm, above 0.40 N/mm, above 0.45 N/mm, above 0.50 N/mm, or even above 0.55 N/mm, when measured at 85° C. (on polyetheylene terephthalate, PET) according to the test method described in the experimental section.

According to a preferred aspect of the electronic device, the pressure sensitive adhesive composition for use herein comprises:
  a) a multi-arm block copolymer of the formula $Q_n$-Y, wherein:
    (i) Q represents an arm of the multi-arm block copolymer and each arm independently has the formula G-R,
    (ii) n represents the number of arms and is a whole number of at least 3, and
    (iii) Y is the residue of a multifunctional coupling agent,
    wherein each R is a rubbery block comprising a polymerized conjugated diene, a hydrogenated derivative of a polymerized conjugated diene, or combinations thereof; and each G is a glassy block comprising a polymerized monovinyl aromatic monomer;
  b) a polymeric plasticizer having a weight average molecular weight $M_w$ comprised between 10,000 and 100,000 g/mol;
  c) at least one hydrocarbon tackifier which is primarily compatible with the rubbery blocks;
  d) a glassy block compatible aromatic resin having a softening point value (RBSP) of at least 150° C., when measured by the ring and ball test method described in the experimental section; and
  e) optionally, a linear block copolymer of the formula L-$(G)_m$, wherein L is a rubbery block comprising a polymerized olefin, a polymerized conjugated diene, a hydrogenated derivative of a polymerized conjugated diene, or any combinations thereof; and wherein m is 1 or 2.

In the context of the present disclosure, it has been surprisingly found that a pressure sensitive adhesive composition comprising a multi-arm styrenic block copolymer of the formula described above, a polymeric plasticizer having a weight average molecular weight $M_w$ comprised between 10,000 and 100,000 g/mol, at least one hydrocarbon tackifier which is primarily compatible with the rubbery blocks, and a glassy block compatible aromatic resin having a softening point value (RBSP) of at least 150° C., when measured by the ring and ball test method described in the experimental section, provides excellent characteristics and performance as to overall VOC levels reduction.

In addition, the pressure sensitive adhesive compositions having the specific composition as described above provide excellent and versatile adhesion characteristics, in particular with respect to various types of substrate, including the so-called LSE and MSE substrates, in combination with high shear strength at elevated temperatures (up to 90° C.). The pressure sensitive adhesives as described herein typically provide a static shear strength performance value of greater than 10,000 min, when measured at 90° C. according to the static shear test method described in the experimental section. Without wishing to be bound by theory, it is believed the high static shear strength performance is mainly due to the presence of the glassy block compatible aromatic resin having a softening point value (RBSP) of at least 150° C. Surprisingly, this high temperature shear performance is not achieved at the detrimental of peel adhesion characteristics, in particular with respect to various types of substrate, including the so-called LSE and MSE substrates. This is surprising result as the incorporation of end-block resins is known to provide stiffness to the resulting block copolymer-based pressure sensitive adhesives, which ultimately is known to detrimentally affect the peel adhesion characteristics especially on difficult to bond substrates (such as LSE substrates).

Surprisingly, the pressure sensitive adhesive compositions having the specific composition as described above provide this combination of advantageous performance characteristics without them being subjected to any post-crosslinking step, in particular crosslinking step with actinic radiation such as e.g. e-beam or UV irradiation. In some aspects, the pressure sensitive adhesive compositions as described herein are free of any crosslinking additive, in particular free of chemical crosslinking additives such as multifunctional (meth)acrylate compounds. This is non-obvious technical approach as further chemical crosslinking is the main technical means commonly used in the art to increase shear and cohesive strength (especially shear performance at elevated temperature) of pressure sensitive adhesives. In addition, reaching high static shear strength performance at high temperature (e.g. 90° C.) without additional crosslinking step was never observed before owing to the strong presumption that a temperature of 90° C. would be too close to the softening point of the hard glassy segments.

The absence of any crosslinking step translates into various benefits. Besides saving an additional process step, the cost of additional expensive process liners and crosslinking additives may be saved. Furthermore, a better homogeneity of properties (in particular with respect to adhesive and cohesive properties) through the thickness of the pressure sensitive adhesive layer may be obtained owing to the absence of crosslinking gradients, which are typically observed in pressure sensitive adhesive layers crosslinked by irradiation treatment (e-beam or UV). This benefit allows in particular manufacturing high thickness pressure sensitive adhesives. Also, the absence of a crosslinking step allows a better formulation flexibility as components known to hinder the crosslinking reactions may not need to be avoided. In particular, pressure sensitive adhesives with higher filler loading (in particular pigments and electrically or thermally conductive fillers) may be easily formulated, which allows in particular manufacturing pressure sensitive adhesives provided with deeper dark colors or more efficient electrical and/or thermal conductivity.

In some aspects, the pressure sensitive adhesive compositions having the specific composition as described above are further characterized by providing excellent shear adhesion failure temperature (SAFT) performance, when measured according to the SAFT test method described in the experimental section.

Furthermore, the use of selected polymeric plasticizers (in particular the polyisobutylene types) has been surprisingly found to provide the resulting pressure sensitive adhesives with not only advantageous processing and low VOC characteristics, but also excellent barrier properties (with respect to oxygen and moisture) and beneficial ageing performance, in particular better resistance to oxidation. Without wishing to be bound by theory, it is further believed that the presence of selected polymeric plasticizers in the pressure sensitive adhesive composition beneficially impacts its low water uptake characteristics.

In some other aspects, the pressure sensitive adhesive compositions for use in the present disclosure are characterized by further providing excellent characteristics and performance as to overall fogging levels reduction. The low fogging characteristics typically translate into improved resistance of outgassed components to condensation, as well as improved thermal stability of the corresponding pressure sensitive adhesive, which characteristics are particularly suited for electronic applications. In some aspects, the pressure sensitive adhesives as described herein may find particular utility in those applications requiring high temperature resistance and ability to maintain holding power at elevated temperature.

As such, the pressure sensitive adhesive compositions, and in particular the pressure sensitive adhesive compositions having the specific composition as described above are outstandingly suited for electronic applications.

In a typical aspect, a rubbery block exhibits a glass transition temperature (Tg) of less than room temperature. In some aspects, the Tg of the rubbery block is less than about 0° C., less than about −10° C., less than about −40° C., or even less than about −60° C.

In a typical aspect, a glassy block exhibits a Tg of greater than room temperature. In some aspects, the Tg of the glassy block is at least about 40° C., at least about 60° C., at least about 80° C., or even at least about 100° C.

The terms "glass transition temperature" and "Tg" are used interchangeably and refer to the glass transition temperature of a material or a mixture. Unless otherwise indicated, glass transition temperature values are determined by Differential Scanning Calorimetry (DSC).

In a particular aspect of the electronic device according to the present disclosure, the multi-arm block copolymer for use herein is such that n ranges from 3 to 15, from 4 to 15, from 6 to 15, or even from 8 to 15. In some other aspects, n is 4, while in some other executions, n is equal to 6 or more.

Suitable rubbery blocks R for use herein comprise polymerized conjugated dienes, hydrogenated derivatives of a polymerized conjugated diene, or combinations thereof. In some typical aspects, the rubbery block of at least one arm comprises a polymerized conjugated diene selected from the group consisting of isoprene, butadiene, ethylene butadiene copolymers, hydrogenated derivatives of polyisoprene or polybutadiene, and combinations or mixtures thereof. According to an advantageous aspect, the rubbery blocks of each arm comprise a polymerized conjugated diene selected from the group consisting of isoprene, butadiene, ethylene butadiene copolymers, hydrogenated derivatives of polyisoprene or polybutadiene, and any combinations or mixtures thereof.

According to a preferred aspect of the pressure sensitive adhesive according to the present disclosure, at least one of the rubbery blocks of the multi-arm block copolymer comprises a conjugated diene selected from the group consisting of isoprene, butadiene, and any combinations thereof. More preferably, each of the rubbery blocks of the multi-arm block copolymer comprises a conjugated diene selected from the group consisting of isoprene, butadiene, and any combinations or mixtures thereof.

According to a particularly advantageous aspect of the pressure sensitive adhesive according to the present disclosure, at least one arm of the multi-arm block copolymer is selected from the group consisting of styrene-isoprene-styrene, styrene-butadiene-styrene, styrene-ethylene-butylene-styrene, styrene-ethylene-propylene-styrene, and combinations thereof. More preferably, each arm of the multi-arm block copolymer is selected from the group consisting of styrene-isoprene-styrene, styrene-butadiene-styrene, styrene-ethylene-butylene-styrene, styrene-ethylene-propylene-styrene, and any combinations thereof. Even more preferably, each arm of the multi-arm block copolymer is selected from the group consisting of styrene-isoprene-styrene, styrene-butadiene-styrene, and any combinations thereof.

Suitable glassy blocks G for use herein comprise a polymerized monovinyl aromatic monomer. In some typical aspects, the glassy block of at least one arm comprises a monovinyl aromatic monomer selected from the group consisting of styrene, styrene-compatible blends, and any combinations thereof. According to an advantageous aspect, the glassy blocks of each arm comprise a monovinyl aromatic monomer selected from the group consisting of styrene, styrene-compatible blends, and any combinations thereof.

According to an advantageous execution of the present disclosure, the multi-arm block copolymer for use herein is a (multi-arm) star block copolymer. In a more advantageous aspect of the pressure sensitive adhesive according to the present disclosure, the multi-arm block copolymer is a polymodal block copolymer. As used herein, the term "polymodal" means that the copolymer comprises endblocks having at least two different molecular weights. Such a block copolymer may also be characterized as having at least one "high" molecular weight endblock, and at least one "low" molecular weight endblock, wherein the terms high and low are used relative to each other. In some particular aspects, the ratio of the number average molecular weight of the high molecular weight endblock, $(M_n)H$, relative to the number average molecular weight of the low molecular weight endblock, $(M_n)L$, is at least about 1.25.

In some particular aspects, $(M_n)H$ ranges from about 5,000 to about 50,000. In some embodiments, $(M_n)H$ is at least about 8,000, and in some aspects at least about 10,000. In some aspects, $(M_n)H$ is no greater than about 35000. In some aspects, $(M_n)L$ ranges from about 1,000 to about 10,000. In some aspects, $(M_n)L$ is at least about 2,000, and, in some aspects, at least about 4,000. In some aspects, $(M_n)L$ is less than about 9,000, and, in some aspects, less than about 8,000.

According to another beneficial aspect, the multi-arm block copolymer is an asymmetric block copolymer. As used herein, the term "asymmetric" means that the arms of the block copolymer are not all identical. Generally, a polymodal block copolymer is an asymmetric block copolymer (i.e., a polymodal asymmetric block copolymer) as not all arms of a polymodal block copolymer are identical since the molecular weights of the end blocks are not all the same. In some aspects, the block copolymers of the present disclosure are polymodal, asymmetric block copolymers.

Multi-arm block copolymers for use herein are described e.g. in U.S. Pat. No. 7,163,741 B1 (Khandpur et al.). Methods of making multi-arm block copolymers, in particular polymodal asymmetric, block copolymers are described in, e.g., U.S. Pat. No. 5,296,547 (Nestegard et al.), or in U.S. Pat. No. 5,393,787 (Nestegard et al.), the content of which is herewith incorporated by reference.

Generally, the multifunctional coupling agent for use herein may be any polyalkenyl coupling agent or other material known to have functional groups that can react with carbanions of the living polymer to form linked polymers. The polyalkenyl coupling agent may be aliphatic, aromatic, or heterocyclic. Exemplary aliphatic polyalkenyl coupling agents include, but are not limited to, polyvinyl and polyalkyl acetylenes, diacetylenes, phosphates, phosphites, and dimethacrylates (e.g., ethylene dimethacrylate). Exemplary aromatic polyalkenyl coupling agents include but are not limited to, polyvinyl benzene, polyvinyl toluene, polyvinyl xylene, polyvinyl anthracene, polyvinyl naphthalene, and divinyldurene. Exemplary polyvinyl groups include, but are not limited to, divinyl, trivinyl, and tetravinyl groups. In some aspects, divinylbenzene (DVB) may be used, and may include o-divinyl benzene, m-divinyl benzene, p-divinyl benzene, and mixtures thereof. Exemplary heterocyclic polyalkenyl coupling agents include, but are not limited to, divinyl pyridine, and divinyl thiophene. Other exemplary multifunctional coupling agents include, but are not limited to, silicon halides, polyepoxides, polyisocyanates, polyketones, polyanhydrides, and dicarboxylic acid esters.

According to a typical aspect, the multi-arm block copolymer as described above is used for example in amounts of up to 80 wt %, based on the weight of the pressure sensitive adhesive. In some exemplary aspects, the amount of multi-arm block copolymer can be for example, in the range of from 20 wt % to 80 wt %, from 20 wt % to 70 wt %, from 25 wt % to 60 wt %, from 30 wt % to 60 wt %, or even from 35 wt % to 60 wt % of the multi-arm block copolymer, based on the weight of the pressure sensitive adhesive.

In some advantageous aspects, the pressure sensitive adhesive of the present disclosure may optionally comprise a linear block copolymer of the formula $L-(G)_m$, wherein L represents a rubbery block, G represents a glassy block, and m, the number of glassy blocks, is 1 or 2. Suitable rubbery blocks L for use herein comprise a polymerized olefin, a polymerized conjugated diene, a hydrogenated derivative of a polymerized conjugated diene, or any combinations thereof; and wherein m is 1 or 2. In the context of the present disclosure, it has been surprisingly found that the addition of a linear block copolymer as described above may provide various beneficial effects to the (co)polymeric precursor of the pressure sensitive adhesive and to the resulting pressure sensitive adhesive. In particular, the addition of a linear block copolymer as described above may additionally provide the resulting pressure sensitive adhesive with an improved tack performance.

In some aspects, m is 1, and the linear block copolymer is a diblock copolymer comprising one rubbery block L and one glassy block G. In some aspects, m is 2, and the linear block copolymer comprises two glassy endblocks and one rubbery midblock, i.e., the linear block copolymer is a triblock copolymer.

In some aspects, the rubbery block L comprises a polymerized conjugated diene, a hydrogenated derivative of a polymerized conjugated diene, or any combinations thereof. In some aspects, the conjugated dienes comprise 4 to 12 carbon atoms. Exemplary conjugated dienes include, but are not limited to, butadiene, isoprene, ethylbutadiene, phenylbutadiene, piperylene, pentadiene, hexadiene, ethylhexadiene, and dimethylbutadiene. The polymerized conjugated dienes may be used individually or as copolymers with each other. Preferably, the rubbery block L of the linear block copolymer comprises a conjugated diene selected from the group consisting of isoprene, butadiene, and any combinations thereof. In some other aspects, the rubbery block L comprises a polymerized olefin, such as e.g. isobutylene.

In some aspects, at least one glassy block G comprises a polymerized monovinyl aromatic monomer. In some other aspects, both glassy blocks of a triblock copolymer comprise a polymerized monovinyl aromatic monomer. In some other aspects, the linear block copolymer comprises two glassy blocks. According to still another aspect, the monovinyl aromatic monomers comprise 8 to 18 carbon atoms. Exemplary monovinyl aromatic monomers include, but are not limited to, styrene, vinylpyridine, vinyl toluene, alpha-methyl styrene, methyl styrene, dimethylstyrene, ethylstyrene, diethyl styrene, t-butylstyrene, di-n-butylstyrene, isopropylstyrene, other alkylated-styrenes, styrene analogs, and styrene homologs. In some aspects, the monovinyl aromatic monomer is selected from the group consisting of styrene, styrene-compatible monomers or monomer blends, and any combinations thereof.

As used herein, "styrene-compatible monomers or monomer blends" refers to a monomer or blend of monomers, which may be polymerized or copolymerized, that preferentially associate with polystyrene or with the polystyrene endblocks of a block copolymer. The compatibility can arise from actual copolymerization with monomeric styrene; solubility of the compatible monomer or blend, or polymerized monomer or blend in the polystyrene phase during hot melt or solvent processing; or association of the monomer or blend with the styrene-rich phase domain on standing after processing.

In some other aspects, the linear block copolymer is a diblock copolymer. In some aspects, the diblock copolymer is selected from the group consisting of styrene-isoprene, and styrene-butadiene. In some aspects, the linear block copolymer is a triblock copolymer. In some aspects, the triblock copolymer is selected from the group consisting of styrene-isoprene-styrene, styrene-butadiene-styrene, styrene-ethylene-butylene-styrene, styrene-ethylene-propylene-styrene, styrene-isobutylene-styrene, and any combinations thereof. Diblock and triblock copolymers are commercially available, e.g., those under the trade name VECTOR available from Dexco Polymer LP, Houston, Tex.; and those available under the trade name KRATON available from Kraton Polymers U.S. LLC, Houston, Tex. As manufactured and/or purchased, triblock copolymers may contain some fraction of diblock copolymer as well.

According to a typical aspect, the optional linear block copolymer as described above is used for example in amounts of up to 80 wt %, based on the weight of the pressure sensitive adhesive composition. In some exemplary aspects, the amount of linear block copolymer can be for example, in the range of from 20 wt % to 80 wt %, from 20 wt % to 70 wt %, from 25 wt % to 60 wt %, from 30 wt % to 60 wt %, or even from 35 wt % to 60 wt %, based on the weight of the pressure sensitive adhesive composition.

The pressure sensitive adhesive composition for use in the present disclosure may further comprise a polymeric plasticizer having a weight average molecular weight $M_w$ comprised between 10,000 and 100,000 g/mol. Any polymeric plasticizers typically known by those skilled in the art may be used in the context of the present disclosure as long as they fulfill the above weight average molecular weight requirement.

The use of polymeric plasticizers having a weight average molecular weight $M_w$ comprised between 10,000 and 100,000 g/mol, may advantageously impact the overall shear performance of the pressure sensitive adhesive, in particular the shear performance at elevated temperature (typically at 70° C.). Additionally, polymeric plasticizers having a weight average molecular weight $M_w$ comprised between 10,000 and 100,000 g/mol have been found to provide excellent characteristics and performance as to reduction of VOC and FOG levels.

Useful polymeric plasticizers for use herein are typically selected to be miscible with the other components in the composition such as the (co)polymeric material and any optional additives. Suitable polymeric plasticizers for use herein may be easily identified by those skilled, in the light of the present disclosure. Typical examples of polymeric plasticizers that can be used herein include, but are not limited to, those selected from the group consisting of polyisobutylenes, polyisoprenes, polybutadienes, amorphous polyolefins and copolymers thereof, silicones, polyacrylates, oligomeric polyurethanes, ethylene propylene copolymers, any combinations or mixtures thereof.

According to an advantageous aspect, the polymeric plasticizer has a weight average molecular weight $M_w$ of less than 95,000 g/mol, less than 90,000 g/mol, less than 80,000 g/mol, less than 70,000 g/mol, less than 60,000 g/mol, less than 50,000 g/mol, or even less than 40,000 g/mol.

The weight average molecular weight $M_w$ of the various polymeric compounds referred to herein (e.g. the plasticizer) may be determined by any methods known to the skilled person, for example Gel Permeation Chromatography (GPC) also known as Size Exclusion Chromatography (SEC) or by light scattering techniques. Unless otherwise stated, the weight average molecular weight $M_w$ of the various polymeric compounds referred to herein (e.g. the plasticizer) is measured by light scattering according to ASTM D4001-13.

Advantageously still, the polymeric plasticizer has a weight average molecular weight $M_w$ of at least 15,000 g/mol, at least 20,000 g/mol, or even at least 30,000 g/mol.

In another advantageous aspect of the pressure sensitive adhesive of the present disclosure, the polymeric plasticizer has a weight average molecular weight $M_w$ comprised between 10,000 and 80,000 g/mol, between 20,000 and 70,000 g/mol, between 25,000 and 65,000 g/mol, between 25,000 and 60,000 g/mol, between 30,000 and 60,000 g/mol, or even between 30,000 and 55,000 g/mol.

Advantageously, the polymeric plasticizer(s) for use herein, have a Volatile Organic Compound (VOC) value of less than 1,000 ppm, less than 800 ppm, less than 600 ppm, less than 400 ppm or even less than 200 ppm, when measured by thermogravimetric analysis according to the weight loss test method described in the experimental section.

Advantageously still, the polymeric plasticizer(s) for use herein, have a Volatile Fogging Compound (FOG) value of less than 2,500 ppm, less than 2,000 ppm, less than 1,500 ppm, less than 1,000 ppm, less than 800 ppm, less than 600 ppm, or even less than 500 ppm, when measured by thermogravimetric analysis according to the weight loss test method described in the experimental section.

According to a particularly preferred execution of the pressure sensitive adhesive of the present disclosure, the polymeric plasticizer is a polyisobutylene plasticizer. Typical examples of polyisobutylene plasticizers that can be used herein include, but are not limited to, those selected among those commercially available from BASF under the trade designation OPPANOL, in particular OPPANOL B series.

According to a typical aspect, the polymeric plasticizers are used for example in amounts of up to 40 wt %, based on the weight of the pressure sensitive adhesive composition. In some aspects, the polymeric plasticizers may be used in amounts up to 35 wt %, up to 30 wt %, or up to 25 wt %, based on the weight of the pressure sensitive adhesive composition. The amount of polymeric plasticizers can be for example, in the range of from 1 wt % to 40 wt %, from 2 wt % to 30 wt %, or even from 5 wt % to 30 wt %, or even from 5 wt % to 25 wt %, based on the weight of the pressure sensitive adhesive composition.

According to another typical aspect of the pressure sensitive adhesive composition, the total amount of the polymeric plasticizers is of no greater than 20 wt %, no greater than 18 wt %, no greater than 15 wt %, or even no greater than 12 wt %, expressed as a percent by weight based on the total weight of the pressure sensitive adhesive composition. In some other aspects, the total amount of the polymeric plasticizers is of no less than 6 wt %, or even no less than 7 wt %, expressed as a percent by weight based on the total weight of the pressure sensitive adhesive composition. In still some other aspects, the total amount of the polymeric plasticizers is comprised between 2 and 20 wt %, between 4 and 15 wt %, between 5 and 12 wt %, or even between 5 and 10 wt %, expressed as a percent by weight based on the total weight of the pressure sensitive adhesive composition.

The pressure sensitive adhesive composition for use in the present disclosure may further comprise at least one hydrocarbon tackifier which is primarily compatible with the rubbery blocks.

As used herein, a tackifier is "compatible" with a block if it is miscible with that block. Generally, the miscibility of a tackifier with a block can be determined by measuring the effect of the tackifier on the Tg of that block. If a tackifier is miscible with a block, it will alter (e.g., increase) the Tg of that block. A tackifier is "primarily compatible" with a block if it is at least miscible with that block, although it may also be miscible with other blocks. For example, a tackifier that is primarily compatible with a rubbery block will be miscible with the rubbery block, but may also be miscible with a glassy block. Generally, resins having relatively low solubility parameters tend to associate with the rubbery blocks. However, their solubility in the glassy blocks tends to increase as the molecular weights or softening points of these resins are lowered.

In an advantageous aspect, the hydrocarbon tackifier(s) which is primarily compatible with at least some of the rubbery blocks is primarily compatible with each rubbery block R of the multi-arm block copolymer and with the rubbery block L of the optional linear block copolymer.

Any hydrocarbon tackifiers typically included in conventional pressure-sensitive adhesive compositions may be used in the context of the present disclosure, as long as they fulfill the above-detailed compatibility requirements. Useful hydrocarbon tackifiers are typically selected to be miscible with the (co)polymeric material. Suitable hydrocarbon tackifier(s) which is primarily compatible with the rubbery blocks for use herein may be easily identified by those skilled in the art, in the light of the present disclosure.

Either solid or liquid hydrocarbon tackifiers may be added, although solid hydrocarbon tackifiers are preferred. Solid tackifiers generally have a number average molecular weight ($M_w$) of 10,000 grams per mole or less and a softening point above about 70° C. Liquid tackifiers are viscous materials that have a softening point of about 0° C. to about 20° C.

Suitable tackifying resins may include terpene resins such as polyterpenes (e.g., alpha pinene-based resins, beta pinene-based resins, and limonene-based resins) and aromatic-modified polyterpene resins (e.g., phenol modified polyterpene resins); coumarone-indene resins; and petroleum-based hydrocarbon resins such as C5-based hydrocarbon resins, C9-based hydrocarbon resins, C5/C9-based hydrocarbon resins, and dicyclopentadiene-based resins. These tackifying resins, if added, can be hydrogenated to lower their color contribution to the particular pressure-sensitive adhesive composition. Combinations of various tackifiers can be used if desired.

Tackifiers that are hydrocarbon resins can be prepared from various petroleum-based feed stocks. There feedstocks can be aliphatic hydrocarbons (mainly C5 monomers with some other monomers present such as a mixture of trans-1,3-pentadiene, cis-1,3-pentadiene, 2-methyl-2-butene, dicyclopentadiene, cyclopentadiene, and cyclopentene), aromatic hydrocarbons (mainly C9 monomers with some other monomers present such as a mixture of vinyl toluenes, dicyclopentadiene, indene, methylstyrene, styrene, and methylindenes), or mixtures thereof. Tackifiers derived from C5 monomers are referred to as C5-based hydrocarbon resins while those derived from C9 monomers are referred to as C9-based hydrocarbon resins. Some tackifiers are derived from a mixture of C5 and C9 monomers or are a blend of C5-based hydrocarbon tackifiers and C9-based hydrocarbon tackifiers. These tackifiers can be referred to as C5/C9-based hydrocarbon tackifiers. Any of these resins can be partially or fully hydrogenated to improve their color, their thermal stability or their process compatibility.

The C5-based hydrocarbon resins are commercially available from Eastman Chemical Company under the trade designations PICCOTAC and EASTOTAC, from Cray Valley under the trade designation WINGTACK, from Neville Chemical Company under the trade designation NEVTAC LX, and from Kolon Industries, Inc. under the trade designation HIKOREZ. The C5-based hydrocarbon resins are commercially available from Eastman Chemical with various degrees of hydrogenation under the trade designation EASTOTACK.

The C9-based hydrocarbon resins are commercially available from Eastman Chemical Company under the trade designation PICCO, KRISTALEX, PLASTOLYN, and PICCOTAC, and ENDEX, from Cray Valley under the trade designations NORSOLENE, from Ruetgers N.V. under the trade designation NOVAREZ, and from Kolon Industries, Inc. under the trade designation HIKOTAC. These resins can be partially or fully hydrogenated. Prior to hydrogenation, the C9-based hydrocarbon resins are often about 40 percent aromatic as measured by proton Nuclear Magnetic Resonance. Hydrogenated C9-based hydrocarbon resins are commercially available, for example, from Eastman Chemical under the trade designations REGALITE and REGALREZ that are 50 to 100 percent (e.g., 50 percent, 70 percent, 90 percent, and 100 percent) hydrogenated. The partially hydrogenated resins typically have some aromatic rings.

Various C5/C9-based hydrocarbon tackifiers are commercially available from Arakawa under the trade designation ARKON, from Zeon under the trade designation QUINTONE, from Exxon Mobil Chemical under the trade designation ESCOREZ, and from Newport Industries under the trade designations NURES and H-REZ (Newport Industries). In the context of the present disclosure, suitable hydrocarbon tackifiers for use herein may be advantageously selected among those C5/C9-based hydrocarbon tackifiers commercially available from Exxon Mobil Chemical under the trade designation ESCOREZ.

Exemplary hydrocarbon tackifiers that are primarily compatible with the rubbery blocks are advantageously selected from the group consisting of aliphatic hydrocarbon resins, cycloaliphatic hydrocarbon resins, aromatic modified aliphatic and cycloaliphatic resins, aromatic resins, hydrogenated hydrocarbon resins, terpene and modified terpene resins, terpene-phenol resins, rosin esters, and any combinations or mixtures thereof.

In an advantageous aspect of the present disclosure, hydrocarbon tackifiers which are primarily compatible with the rubbery blocks are selected from the group consisting of polymeric terpenes, hetero-functional terpenes, coumarone-indene resins, rosin acids, esters of rosin acids, disproportionated rosin acid esters, hydrogenated, C5 aliphatic resins, C9 hydrogenated aromatic resins, C5/C9 aliphatic/aromatic resins, dicyclopentadiene resins, hydrogenated hydrocarbon resins arising from C5/C9 and dicyclopentadiene precursors, hydrogenated styrene monomer resins, and any blends thereof.

According to an advantageous aspect, the hydrocarbon tackifier which is primarily compatible with the rubbery blocks has a Volatile Organic Compound (VOC) value of less than 1,000 ppm, when measured by thermogravimetric analysis according to the weight loss test methods described in the experimental section.

In a particular aspect of the pressure sensitive adhesive composition for use in the electronic device according to the present disclosure, the hydrocarbon tackifier(s) for use herein have a Volatile Organic Compound (VOC) value of less than 800 ppm, less than 600 ppm, less than 400 ppm or even less than 200 ppm, when measured by thermogravimetric analysis according to the weight loss test method described in the experimental section.

According to a preferred aspect, the hydrocarbon tackifier(s) for use herein have a Volatile Fogging Compound (FOG) value of less than 1,500 ppm, less than 1,000 ppm, less than 800 ppm, less than 600 ppm, or even less than 500 ppm, when measured by thermogravimetric analysis according to the weight loss test methods described in the experimental section.

A pressure sensitive adhesive composition comprising a rubber-based elastomeric material and at least one hydrocarbon tackifier which is primarily compatible with the rubbery blocks, wherein the hydrocarbon tackifier(s) have a Volatile Fogging Compound (FOG) value of less than 1,500 ppm, less than 1,000 ppm, less than 800 ppm, less than 600 ppm, or even less than 500 ppm, when measured by thermogravimetric analysis according to the weight loss test method described in the experimental section, provide excellent characteristics and performance as to resistance of outgassed components to condensation and/or thermal stability of the corresponding pressure sensitive adhesive. Pressure sensitive adhesives provided with advantageous low fogging characteristics are particularly suited for electronic applications.

In some aspects of the pressure sensitive adhesive composition for use in the present disclosure, the hydrocarbon tackifier(s) for use herein have a Tg of at least 65° C., or even at least 70° C. In some aspects, all the hydrocarbon tackifier(s) for use herein have a Tg of at least 65° C., or even at least 70° C.

In some aspects of the pressure sensitive adhesive for use in the present disclosure, the hydrocarbon tackifier(s) for use herein have a softening point of at least about 115° C., or even at least about 120° C. In some aspects, all the hydrocarbon tackifier(s) for use herein have a softening point of at least about 115° C., or even at least about 120° C.

According to a typical aspect of the pressure sensitive adhesive, any of the hydrocarbon tackifiers for use herein may be used for example in amounts of up to 80 wt %, based on the weight of the pressure sensitive adhesive composition. In some aspects, the tackifiers for use herein can be used in amounts up to 70 wt %, up to 60 wt %, up to 55 wt %, or even up to 50 wt %, based on the weight of the pressure sensitive adhesive composition. The amount of tackifiers can be for example, in the range of from 5 wt % to 60 wt %, from 5 wt % to 50 wt %, from 10 wt % to 45 wt %, or even from 15 wt % to 45 wt %, based on the weight of the pressure sensitive adhesive composition.

According to a typical aspect, the hydrocarbon tackifier(s) which are primarily compatible with the rubbery blocks are used in amounts ranging from 20 wt % to 70 wt %, from 25 wt % to 60 wt %, or even from 25 wt % to 50 wt %, based on the weight of the pressure sensitive adhesive composition.

The pressure sensitive adhesive composition for use in the electronic device according to the present disclosure may further comprise a glassy block compatible aromatic resin having a softening point value (RBSP) of at least 150° C., when measured by the ring and ball test method described in the experimental section.

In the context of the present disclosure, the expression "glassy block compatible aromatic resin" is meant to refer to an aromatic resin which is compatible with the glassy blocks, wherein the term "compatible" is as defined hereinbefore.

In an advantageous aspect, the glassy block compatible aromatic resin having a softening point value (RBSP) of at least 150° C. is compatible with each glassy block G of the multi-arm block copolymer and with the glassy block G of the optional linear block copolymer.

In the context of the present disclosure, it has been surprisingly been found that the presence of a glassy block compatible aromatic resin having a softening point value (RBSP) of at least 150° C., when measured by the ring and ball test method, allows the resulting pressure sensitive adhesive to be provided with high peel adhesion performance and high shear strength at elevated temperatures, not only at 70° C. but up to 90° C. This property makes the resulting pressure sensitive adhesive outstandingly suitable to withstand the relatively elevated temperatures, and optionally high humidity conditions which may be typically experienced in modern electronic devices.

Any glassy block compatible aromatic resins typically included in conventional pressure-sensitive adhesive compositions may be used in the context of the present disclosure, as long as they fulfill the above-detailed softening point requirement. Glassy block compatible aromatic resins for use herein may be easily identified by those skilled in the art, in the light of the present disclosure.

According to an advantageous aspect of the pressure sensitive adhesive composition, the glassy block compatible aromatic resin for use herein has a softening point value (RBSP) of at least 155° C., at least 160° C., at least 165° C., at least 170° C., at least 180° C., at least 190° C. or even at least 200° C., when measured by the ring and ball test method described in the experimental section.

According to another advantageous aspect of the pressure sensitive adhesive composition, the glassy block compatible aromatic resin for use herein has a weight average molecular weight $M_w$ of 30,000 g/mol or less, of 25,000 g/mol or less, of 20,000 g/mol or less, of 15,000 g/mol or less, or even of 10,000 g/mol or less.

In a preferred aspect, the pressure sensitive adhesive for use in the present disclosure comprises a glassy block compatible aromatic resin having a glass transition temperature (Tg) of at least 100° C., at least 110° C., at least 120° C., at least 130° C., at least 140° C., at least 150° C., or even at least 160° C.

According to an exemplary aspect of the pressure sensitive adhesive, the glassy block compatible aromatic resin for use herein has a weight average molecular weight $M_w$ of 10,000 g/mol or less, less than 9,000 g/mol, less than 8,000 g/mol, less than 6,000 g/mol, less than 4,000 g/mol, or even less than 2,000 g/mol.

According to another exemplary aspect of the pressure sensitive adhesive, the glassy block compatible aromatic resin for use herein has a weight average molecular weight $M_w$ of at least 1,000 g/mol, at least 2,000 g/mol, at least 3,000 g/mol, or even at least 4,000 g/mol.

According to still another exemplary aspect of the present disclosure, the pressure sensitive adhesive composition comprises a glassy block compatible aromatic resin having a weight average molecular weight $M_w$ comprised between 1,000 and 9,500 g/mol, or even between 2,000 and 9,000 g/mol.

According to a typical aspect, the glassy block compatible aromatic resin for use herein is essentially a hydrocarbon aromatic resin, but the disclosure is not that limited.

In a preferred aspect of the present disclosure, the glassy block compatible aromatic resin for use herein is selected from the group consisting of hydrocarbon aromatic resins, arylene oxide resins, C9-based hydrocarbon aromatic resins, C9-based hydrogenated hydrocarbon aromatic resins, polyarylene oxide resins, in particular polyphenylene oxides or polyphenylene ethers, indene coumarone resins, aromatic resins based on copolymers of C9 with maleic anhydride, and any combinations or mixtures thereof. In still a preferred aspect, the glassy block compatible aromatic resin for use herein is selected from the group consisting of hydrocarbon aromatic resins, arylene oxide resins, and any combinations thereof.

According to an advantageous aspect of the pressure sensitive adhesive composition, the glassy block compatible aromatic resin for use herein is selected from the group consisting of C9-based hydrocarbon aromatic resins, C9-based hydrogenated hydrocarbon aromatic resins, polyarylene oxide resins, in particular polyphenylene oxides or polyphenylene ethers.

According to a particularly advantageous aspect of the pressure sensitive adhesive composition, the glassy block compatible aromatic resin for use herein is selected from the group of C9-based hydrocarbon aromatic resins.

According to another particularly advantageous aspect of the pressure sensitive adhesive composition, the glassy block compatible aromatic resin for use herein is selected from the group of polyphenylene oxides or polyphenylene ethers.

In a preferred aspect, the pressure sensitive adhesive composition for use in the present disclosure comprises a glassy block compatible aromatic resin having a Volatile Organic Compound (VOC) value of less than 1000 ppm, less than 800 ppm, less than 600 ppm, less than 500 ppm, or even less than 400 ppm, when measured by thermogravimetric analysis according to the weight loss test methods described in the experimental section.

In another preferred aspect, the pressure sensitive adhesive composition for use in the present disclosure comprises a glassy block compatible aromatic resin having a Volatile Fogging Compound (FOG) value of less than 1500 ppm, less than 1000 ppm, less than 800 ppm, less than 600 ppm, or even less than 500 ppm, when measured by thermogravimetric analysis according to the weight loss test methods described in the experimental section.

According to typical aspect, the pressure sensitive adhesive composition for use in the present disclosure comprises a glassy block compatible aromatic resin in an amount which is of no greater than 20 wt %, no greater than 18 wt %, no greater than 15 wt %, or even no greater than 12 wt %, expressed as a percent by weight based on the total weight of the pressure sensitive adhesive composition.

According to another typical aspect of the pressure sensitive adhesive composition, the total amount of the glassy block compatible aromatic resin is of no less than 2 wt %, no less than 4 wt %, or even no less than 5 wt %, expressed as a percent by weight based on the total weight of the pressure sensitive adhesive composition.

According to a preferred aspect of the pressure sensitive adhesive composition, the total amount of glassy block compatible aromatic resin is comprised between 0.5 and 35 wt %, between 1 and 30 wt %, between 2 and 25 wt %, or even between 5 and 25 wt %, expressed as a percent by weight based on the total weight of the pressure sensitive adhesive composition.

In some aspects, the pressure sensitive adhesive composition for use in the present disclosure may further comprise, as an optional ingredient, a filler material. Such fillers may be advantageously used to e.g. increase the mechanical stability of the pressure sensitive adhesive and may also increase its shear and peel force resistance.

Any filler material commonly known to those skilled in the art may be used in the context of the present disclosure. Typical examples of filler material that can be used herein include, but are not limited to, those selected from the group consisting of expanded perlite, microspheres, expandable microspheres, ceramic spheres, zeolites, clay fillers, glass beads, hollow inorganic beads, silica type fillers, hydrophobic silica type fillers, hydrophilic silica type fillers, fumed silica, fibers, in particular glass fibers, carbon fibers, graphite fibers, silica fibers, ceramic fibers, electrically and/or thermally conducting particles, nanoparticles, in particular silica nanoparticles, and any combinations thereof.

In a particular aspect of the present disclosure, the pressure sensitive adhesive composition may comprise a filler material selected from the group consisting of microspheres, expandable microspheres, preferably pentane filled expandable microspheres, gaseous cavities, glass beads, glass microspheres, glass bubbles and any combinations or mixtures thereof. More typically, the pressure sensitive adhesive may optionally comprise a filler material selected from the group consisting of expandable microspheres, glass bubbles, and any combinations or mixtures thereof.

When present, the filler material for use herein may be used in the pressure sensitive adhesive composition, in any suitable amounts. In some exemplary aspects, the filler material is present in amounts up to 30 parts by weight, up to 25 parts by weight, or even up to 20 parts by weight of the pressure sensitive adhesive composition. In some other exemplary aspects, this amount is typically of at least 1 part by weight, or at least 3 parts by weight of the pressure sensitive adhesive composition.

Accordingly, in some exemplary aspects, the filler material is present in amounts in a range of from 1 to 20 parts, from 3 to 15 parts by weight, or even from 5 to 13 parts by weight of the pressure sensitive adhesive composition. In some other exemplary aspects, the filler material is present in amounts in a range of from 1 to 20 parts, from 2 to 15 parts by weight, or even from 2 to 10 parts by weight of the pressure sensitive adhesive composition.

According to one preferred aspect, the pressure sensitive adhesive composition for use in the electronic device according to the present disclosure comprises:
  a) from 20 wt % to 80 wt %, from 20 wt % to 70 wt %, from 25 wt % to 60 wt %, from 30 wt % to 60 wt %, or even from 35 wt % to 60 wt % of the multi-arm block copolymer, based on the weight of the pressure sensitive adhesive;
  b) from 20 wt % to 70 wt %, from 25 wt % to 60 wt %, or even from 25 wt % to 50 wt % of the hydrocarbon tackifier which is primarily compatible with the rubbery blocks, based on the weight of the pressure sensitive adhesive;
  c) from 2 wt % to 20 wt %, from 4 wt % to 15 wt %, from 5 wt % to 12 wt %, or even from 5 wt % to 10 wt % of a polymeric plasticizer, based on the weight of the pressure sensitive adhesive;
  d) from 0.5 to 35 wt %, from 1 to 30 wt %, from 2 to 25 wt %, or even from 5 to 25 wt % of the glassy block compatible aromatic resin;
  e) optionally, from 20 wt % to 80 wt %, from 20 wt % to 70 wt %, from 25 wt % to 60 wt %, from 30 wt % to 60 wt %, or even from 35 wt % to 60 wt % of the linear block copolymer, based on the weight of the pressure sensitive adhesive; and
  f) optionally, from 2 wt % to 30 wt %, from 2 wt % to 20 wt %, or even from 2 wt % to 15 wt % of a filler material preferably selected from the group of expandable microspheres and glass bubbles, based on the weight of the pressure sensitive adhesive.

As will be apparent to those skilled in the art and in the light of the present disclosure, other additives may optionally be included in the pressure sensitive adhesive composition to achieve any desired properties. Such additives include, but are not limited to, further tackifiers, pigments, toughening agents, compatible agents, fire retardants, antioxidants, polymerization initiators, and various stabilizers. The additives are typically added in amounts sufficient to obtain the desired end properties.

According to an advantageous aspect, the pressure sensitive adhesive composition for use in the present disclosure is (substantially) free of any processing oil. According to a particular aspect, the pressure sensitive adhesive of the present disclosure is (substantially) free of mineral (hydrocarbon) oil, in particular (substantially) free of paraffinic or naphthenic oils.

According to another advantageous aspect, the pressure sensitive adhesive composition for use in the present disclosure is (substantially) free of functionalized isobutylene (co)polymers, in particular (substantially) free of isobutylene (co)polymers having (pendent) alkoxysilane groups.

According to still another advantageous aspect, the pressure sensitive adhesive composition for use in the present disclosure is (substantially) free of (meth)acrylate monomers and (substantially) free of oligomers having (meth)acrylic functionalities.

According to a typical aspect, the pressure sensitive adhesive composition for use herein is non-crosslinked. In the context of the present disclosure, the term "non-crosslinked" is meant to express that the pressure sensitive adhesive composition is substantially free of chemical crosslinking caused by the use of chemical crosslinking agents and/or a treatment causing chemical crosslinking of the pressure sensitive adhesive.

According to a particular aspect of the present disclosure, the pressure sensitive adhesive is not crosslinked with actinic radiation, in particular with e-beam or UV irradiation treatment.

According to another particular aspect, the pressure sensitive adhesive composition for use herein is (substantially) free of any crosslinking additive, in particular free of multifunctional (meth)acrylate compounds.

According to an alternative aspect of the present disclosure, the pressure sensitive adhesive composition may comprise, as an optional ingredient, a crosslinking additive (also referred to as crosslinking agent). A crosslinking additive may be used to increase the cohesive strength and the tensile strength of the polymeric material. Suitable crosslinking additives for use herein may be easily identified by those skilled in the art, in the light of the present disclosure. Exemplary crosslinking methods include, but are not limited to, thermal, moisture, photosensitive, actinic or ionizing radiation (such as gamma or e-beam radiation) crosslinking.

According to a particular aspect, the pressure sensitive adhesive composition for use in the present disclosure is a hot melt pressure sensitive adhesive. As used herein, a hot melt pressure sensitive adhesive is a polymer or blended polymeric material with a melt viscosity profile such that it can be coated on a substrate or carrier in a thin layer at a process temperature significantly above normal room temperature, but retains useful pressure-sensitive adhesive characteristics at room temperature. In an exemplary aspect, the pressure sensitive adhesive composition for use herein is obtained by a hotmelt extrusion process, in particular an extrusion processing step selected from the group consisting of multi screw extrusion processing steps, planetary extrusion processing steps, and any combinations thereof.

According to another particular aspect, the pressure sensitive adhesive composition for use herein is a solvent-based adhesive.

The pressure-sensitive adhesive compositions for use in the present disclosure can be manufactured using any methods commonly known in the art. As a way of example, they can be made by dissolving the synthetic rubber block (co)polymer(s), any suitable tackifiers, any suitable aromatic resins, any plasticizer(s), and any other additives in a suitable solvent, creating a solvent-based adhesive.

The adhesive composition may then be coated onto a substrate (e.g., release liner, tape backing, core, or panel) using conventional means (e.g., knife coating, roll coating, gravure coating, rod coating, curtain coating, spray coating, air knife coating). In some aspects, the adhesive is then dried to remove at least some of the solvent. In some advantageous aspects, substantially all of the solvent is removed.

In some alternative executions, the pressure-sensitive adhesive composition is prepared in a substantially solvent-free process (i.e., the adhesive contain no greater than about 10 wt. % solvent, in some aspects, no greater than about 5 wt. % solvent, and in some aspects no greater than 1 wt. % solvent or even no greater than trace amounts of solvent (i.e., essentially no solvent). In some aspects, the pressure sensitive adhesive may contain residual solvents, e.g., adhesives may be prepared in solvent, and the solvent is removed prior to subsequent processing, e.g., coating. Generally, the residual solvent is present as no greater than about 5%, in some aspects, no greater than about 1%, or even no greater than trace amounts of solvent (i.e., essentially no solvent). Such substantially solvent-free processes are known and include, e.g., compounding by calendering or roll milling, and extruding (e.g., single screw, twin screw, disk screw, reciprocating single screw, pin barrel single screw, planetary extrusion, etc.). Commercially available equipment such as BRABENDER or BANBURY internal mixers are also available to batch mix the adhesive compositions. After compounding, the adhesive may be coated through a die into a desired form, such as a layer of adhesive, or it may be collected for forming at a later time.

In some aspects, solvent-based adhesives may be used. In some aspects, such adhesives comprise at least about 20% by weight solvent, in some aspects, at least about 40%, at least about 50%, or even at least about 60% by weight solvent. Any known method of coating and drying solvent based adhesives may be used.

According to an advantageous aspect, the pressure sensitive adhesive composition for use in the present disclosure is in the form of a layer having a thickness of less than 1,500 µm, less than 1,000 µm, less than 800 µm, less than 600 µm, less than 400 µm, less than 200 µm, less than 150 µm, or even less than 100 µm.

According to another advantageous aspect, the pressure sensitive adhesive composition for use in the present disclosure is in the form of a layer having a thickness comprised between 5 and 1,500 µm, between 5 and 1,000 µm, between 10 and 500 µm, between 10 and 300 µm, between 15 and 250 µm, between 15 and 100 µm, or even between 15 and 50 µm.

Advantageously still, the pressure sensitive adhesive composition is in the form of a layer having a thickness comprised between 20 and 1,500 µm, between 20 and 1,000 µm, between 20 and 500 µm, between 30 and 400 µm, between 30 and 250 µm, between 40 and 200 µm, or even between 50 and 150 µm.

According to still another advantageous aspect, the pressure sensitive adhesive composition for use herein is in the form of a layer having a thickness comprised between 100 and 6,000 µm, between 200 and 4,000 µm, between 500 and 2,000 µm, or even between 800 and 1,500 µm.

The pressure sensitive adhesive composition for use in the present disclosure may take the form of a single layer construction, and consist essentially of a pressure sensitive adhesive layer. Such a single pressure sensitive adhesive layer can be advantageously used as double-sided adhesive tape.

According to another aspect, the pressure sensitive adhesive composition for use in the electronic device of the present disclosure takes the form of a multilayer pressure sensitive adhesive construction comprising a pressure sensitive adhesive composition as described above and a backing layer adjacent to the pressure sensitive adhesive layer. The multilayer pressure sensitive adhesive construction for use herein may have a design or configuration of any suitable kind, depending on its ultimate application and the desired properties, and provided it comprises at least a pressure sensitive adhesive composition as described above.

According to an exemplary aspect, the multilayer pressure sensitive adhesive construction comprises two or more superimposed layers, i.e. the pressure sensitive adhesive layer and adjacent layers such as e.g. a backing layer and/or further pressure sensitive adhesive layers. Such multilayer pressure sensitive adhesive constructions or tapes may be advantageously used as a dual-layer adhesive tape to adhere two objects to one another. In that context, suitable backing layers for use herein may or may not exhibit at least partial pressure sensitive adhesive characteristics.

Accordingly, in one particular aspect, the multilayer pressure sensitive adhesive construction for use herein comprises a backing layer having a first major surface and a second major surface; and a first pressure sensitive adhesive skin layer bonded to the first major surface, wherein the first pressure sensitive adhesive skin layer comprises a pressure sensitive adhesive composition as described above.

In some other executions, the multilayer pressure sensitive adhesive construction further comprises a second pressure sensitive adhesive skin layer bonded to the second major surface. Such a pressure sensitive adhesive construction reflects a three-layer design, in which the backing layer may be sandwiched between e.g. two pressure sensitive adhesive layers. In some aspects of the multilayer pressure sensitive adhesive construction, the first pressure sensitive adhesive skin layer and the second pressure sensitive adhesive skin layer are the same adhesive, and comprise a pressure sensitive adhesive composition as described above. In some alternative aspects, the first pressure sensitive adhesive skin layer and the second pressure sensitive adhesive skin layer each independently comprise a pressure sensitive adhesive composition as described above.

In some executions, the multilayer pressure sensitive adhesive construction according to the present disclosure may advantageously be in the form of a skin/core/skin multilayer assembly, wherein the backing layer is the core layer of the multilayer pressure sensitive adhesive construction. As used herein, the term "core" may be used interchangeably with the term "backing".

Any known backing or core may be used herein. Suitable backing layers can be made from plastics (e.g., polypropylene, including biaxially oriented polypropylene, vinyl, polyolefin e.g. polyethylene, polyurethanes, polyurethane acrylates, polyesters such as polyethylene terephthalate), nonwovens (e.g., papers, cloths, nonwoven scrims), metal foils, foams (e.g., polyacrylic, polyethylene, polyurethane, neoprene), and the like.

According to a preferred aspect of the multilayer pressure sensitive adhesive construction for use herein, the backing takes the form of a polymeric foam layer. In the context of the present disclosure, the term "polymeric foam" is meant to designate a material based on a polymer and which material comprises voids, typically in an amount of at least 5% by volume, typically from 10% to 80% by volume or from 10% to 65% by volume. The voids may be obtained by any of the known methods such as cells formed by gas. Alternatively, the voids may result from the incorporation of hollow fillers, such as hollow polymeric particles, hollow glass microspheres, hollow ceramic microspheres. According to another alternative aspect, the voids may result from the incorporation of heat expandable microspheres, preferably pentane filled expandable microspheres. The heat expandable microspheres for use herein may be expanded when the polymer melt passes an extrusion die. Polymer mixtures containing expandable microspheres may also be extruded at temperatures below their expansion temperature and expanded in a later step by exposing the tape to temperatures above the expansion temperature of the microspheres. Alternatively, the voids can result from the decomposition of chemical blowing agents.

A polymeric foam layer typically has a density comprised between 0.30 g/cm$^3$ and 1.5 g/cm$^3$, between 0.35 g/cm$^3$ and 1.10 g/cm$^3$, or even between 0.40 g/cm$^3$ and 0.95 g/cm$^3$. This density is achieved by including voids or cells. Typically, the polymeric foam layer will comprise at least 5% of voids by volume and for example between 15 and 45%, or between 20% and 45% by volume.

The voids or cells in the polymeric foam layer can be created in any of the known manners described in the art and include the use of a gas or blowing agent and/or incorporation of hollow fillers, such as hollow polymeric particles, hollow glass microspheres, hollow ceramic microspheres or expandable microspheres, preferably pentane filled expandable microspheres, into the composition for the polymeric foam layer.

A polymeric foam layer for use herein has for example a thickness comprised between 100 and 6,000 µm, between 200 and 4,000 µm, between 500 and 2,000 µm, or even between 800 and 1,500 µm. As will be apparent to those skilled in the art, in the light of the present description, the preferred thickness of the polymeric foam layer will be dependent on the intended application.

In some aspects the polymeric foam layer has viscoelastic properties at room temperature. In some other aspects, the foam may comprise a thermoplastic foam. In some other aspects, the foam may comprise a thermoset foam. Exemplary foams are also described in, e.g., the *Handbook of Polymer Foams*, David Eaves, editor, published by Shawbury, Shrewsbury, Shropshire, UK: Rapra Technology, 2004.

Multilayer pressure sensitive adhesive constructions comprising a backing in the form of a polymeric foam layer, are particularly advantageous when compared to single-layer pressure sensitive adhesives, in that adhesion (quick adhesion) can be adjusted by the formulation of the pressure sensitive adhesive layer (also commonly referred to as the skin layer), while other properties/requirements of the overall assembly such as application issues, deforming issues and energy distribution may be addressed by appropriate formulation of the polymeric foam layer (also commonly referred to as the core layer).

According to a typical aspect of the multilayer pressure sensitive adhesive construction for use herein, the backing layer comprises a polymer base material selected from the group consisting of rubber-based elastomeric materials, polyacrylates, polyurethanes, polyolefins, polyamides, polyesters, polyethers, polyisobutylene, polystyrenes, polyvinyls, polyvinylpyrrolidone, and any combinations, copolymers or mixtures thereof.

In an advantageous aspect, the backing layer comprises a polymer base material selected from the group consisting of rubber-based elastomeric materials. Advantageously, the rubber-based elastomeric material is selected from the group consisting of natural rubbers, synthetic rubbers, thermoplastic elastomeric materials, non-thermoplastic elastomeric materials, thermoplastic hydrocarbon elastomeric materials, non-thermoplastic hydrocarbon elastomeric materials, and any combinations or mixtures thereof.

In some aspects of the multilayer pressure sensitive adhesive construction, the rubber-based elastomeric material is selected from the group consisting of halogenated butyl rubbers, in particular bromobutyl rubbers and chlorobutyl rubbers; halogenated isobutylene-isoprene copolymers; bromo-isobutylene-isoprene copolymers; chloro-isobutylene-isoprene copolymers; block copolymers; olefinic block copolymers; butyl rubbers; synthetic polyisoprene; ethylene-octylene rubbers; ethylene-propylene rubbers; ethylene-propylene random copolymers; ethylene-propylene-diene monomer rubbers; polyisobutylenes; poly(alpha-olefin); ethylene-alpha-olefin copolymers; ethylene-alpha-olefin block copolymers; styrenic block copolymers; styrene-isoprene-styrene block copolymers; styrene-butadiene-styrene block copolymers; styrene-ethylene-butylene-styrene block copolymers; styrene-ethylene-propylene-styrene block copolymers; styrene-butadiene random copolymers; olefinic polymers and copolymers; ethylene-propylene random copolymers; ethylene-propylene-diene terpolymers, and any combinations or mixtures thereof.

In some other aspects, the rubber-based elastomeric material is selected from the group consisting of styrenic block copolymers, and any combinations or mixtures thereof. In an exemplary aspect of the multilayer pressure sensitive adhesive construction, the rubber-based elastomeric material is selected from the group consisting of styrene-isoprene-styrene block copolymers, styrene-butadiene-styrene block copolymers, styrene-ethylene-butylene-styrene block copolymers, and any combinations or mixtures thereof.

In another exemplary aspect, the rubber-based elastomeric material is selected from the group consisting of styrene-isoprene-styrene block copolymers, styrene-butadiene-styrene block copolymers, and any combinations or mixtures thereof.

In some typical aspects, the backing layer further comprises at least one filler material which is preferably selected from the group consisting of microspheres; expandable microspheres, preferably pentane filled expandable microspheres; gaseous cavities; glass beads; glass microspheres; glass bubbles and any combinations or mixtures thereof; more preferably from the group consisting of expandable microspheres, glass bubbles, and any combinations or mixtures thereof. Preferably, the at least one filler material is selected from the group consisting of expandable microspheres, glassbubbles, and any combinations or mixtures thereof.

In some particular aspects of the multilayer pressure sensitive adhesive construction for use herein, a primer layer may be interposed between the pressure sensitive adhesive layer(s) and the backing (or core) layer. In the context of the present disclosure, any primer compositions commonly known to those skilled in the art may be used. Finding appropriate primer compositions is well within the capabilities of those skilled in the art, in the light of the present disclosure. Useful primers for use herein are described e.g. in U.S. Pat. No. 5,677,376 (Groves) and U.S. Pat. No. 5,605,964 (Groves), the content of which is herewith incorporated by reference.

The thickness of the various pressure sensitive adhesive layer(s) and other optional layer(s) comprised in the multilayer pressure sensitive adhesive construction may vary in wide ranges depending on the desired execution and associated properties. By way of example, the thickness can be independently chosen for each layer between 25 µm and 6,000 µm, between 40 µm and 3,000 between 50 µm and 3,000 between 50 µm and 2,000 or even between 50 µm and 1,500 µm.

According to the particular execution wherein the multilayer pressure sensitive adhesive construction takes the form of a skin/core type multilayer pressure sensitive adhesive construction, wherein the backing layer is the core layer of the multilayer pressure sensitive adhesive construction and the pressure sensitive adhesive layer is the skin layer of the multilayer pressure sensitive adhesive construction, it is preferred that the pressure sensitive adhesive layer has a lower thickness compared to the backing/core layer. This is particularly advantageous in executions where the multilayer pressure sensitive adhesive construction takes the form of a polymeric foam pressure sensitive adhesive tape. As a way of example, the thickness of the pressure sensitive adhesive layer may typically be in the range from 20 µm to 250 µm, or even from 40 µm to 200 µm, whereas the thickness of the backing foam layer may typically be in the range from 100 µm to 6,000 µm, from 400 µm to 3,000 µm, or even from 800 µm to 2,000 µm. Such multilayer pressure sensitive adhesive constructions typically exhibit high peel adhesion. Without wishing to be bound by theory, it is believed such high peel adhesion is caused by a stabilizing effect of the relatively thick polymeric foam layer compared to the pressure sensitive adhesive layer.

According to a particularly advantageous aspect, the pressure sensitive adhesive composition or the multilayer pressure sensitive adhesive construction as described above, has a Volatile Organic Compound (VOC) value of less than 2,000 ppm, less than 1,500 ppm, less than 1,000 ppm, less than 800 ppm, less than 600 ppm, less than 500 ppm, less than 400 ppm, or even less than 300 ppm, when measured by thermogravimetric analysis according to the weight loss test method described in the experimental section.

Advantageously still, the pressure sensitive adhesive composition or the multilayer pressure sensitive adhesive construction as described above, has a Volatile Organic Compound (VOC) value of less than 2,000 ppm, less than 1,500 ppm, less than 1,000 ppm, less than 800 ppm, less than 600 ppm, less than 500 ppm, less than 400 ppm, or even less than 300 ppm, when measured by thermal desorption analysis according to test method VDA278 (Thermal Desorption Analysis of Organic Emissions for the Characterization of Non-Metallic Materials for Automobiles) from VDA, Association of the German Automobile Industry.

Advantageously still, the pressure sensitive adhesive composition or the multilayer pressure sensitive adhesive construction as described above, has a Volatile Fogging Compound (FOG) value of less than 4,000 ppm, less than 3,000 ppm, less than 2,500 ppm, less than 2,000 ppm, less than 1,500 ppm, less than 1,000 ppm, less than 800 ppm, less than 600 ppm, less than 500 ppm, or even less than 400 ppm, when measured by thermogravimetric analysis according to the weight loss test method described in the experimental section.

Advantageously still, the pressure sensitive adhesive composition or the multilayer pressure sensitive adhesive construction as described above, has a Volatile Fogging Compound (FOG) value of less than 4,000 ppm, less than 3,000 ppm, less than 2,500 ppm, less than 2000 ppm, less than 1,500 ppm, less than 1,000 ppm, less than 800 ppm, less than 600 ppm, less than 500 ppm, or even less than 400 ppm, when measured by thermal desorption analysis according to test method VDA278 (Thermal Desorption Analysis of Organic Emissions for the Characterization of Non-Metallic Materials for Automobiles) from VDA, Association of the German Automobile Industry.

According to another advantageous execution, the pressure sensitive adhesive composition or the multilayer pressure sensitive adhesive construction as described above, has a static shear strength value of more than 2,000 min, more than 4,000 min, more than 6,000 min, more than 8,000 min, or even more than 10,000 min, when measured at 70° C. according to the static shear test method described in the experimental section.

According to still another advantageous execution, the pressure sensitive adhesive composition or the multilayer pressure sensitive adhesive construction as described above, has a static shear strength value of more than 2,000 min, more than 4,000 min, more than 6,000 min, more than 8,000 min, or even more than 10,000 min, when measured at 90° C. according to the static shear test method described in the experimental section.

According to a typical aspect of the electronic device according to the present disclosure, the pressure sensitive adhesive composition is part of a multilayer assembly comprising at least one organic layer which comprises organic light-emitting diodes.

As will be apparent to those skilled in the art, the multilayer assembly for use herein may comprise various additional layers or components depending on the ultimate function or purpose of the corresponding electronic devices. Exemplary assemblies may include additional layers selected from optically clear substrates, electrically conductive metal layers, electrically conductive organic layers, semi-conductive inorganic layers, semi-conductive organic layers, polymeric substrates, barrier films, electroconductive traces, encapsulant layers, backing layers, antireflection films, polarizing films, retardation films, active layers, and functional layers.

According to one particular aspect of the electronic device, the multilayer assembly comprises an optically clear substrate. In the context of the present disclosure, a substrate is considered optically clear, if it provides an optical transmission of at least 90% over a wavelength range of from 50 to 110 nm. Optical transmission measurement methods are commonly known in the art. An exemplary method is described in ASTM E903.

In one particular aspect of the electronic device, the optically clear substrate is selected from glass substrates (such as borosilicate or soda lime).

In another particular aspect of the electronic device, the optically clear substrate is selected from polymeric substrates. Optically clear polymeric substrates include those made from polyester resins such as polyethylene terephthalate and polyethylene naphthalate, acetate resins, polyethersulfone resins, polycarbonate resins, polyamide resins, polyimide resins, polyolefin resins, (meth)acrylic resins such as polymethylmethacrylate resins, polyvinyl chloride resins, polyvinylidene chloride resins, polystyrene resins, polyvinyl alcohol resins, polyarylate resins, cycloolefin reins, and polyphenylene sulfide resins.

According to an exemplary aspect of the electronic device, the multilayer assembly further comprises metal electrodes, in particular an anode (preferably formed from an electrically conductive material such as indium tin oxide) and a cathode (preferably formed from a low work function metal such as lithium, magnesium, indium, calcium or barium), wherein the at least one organic layer which comprises organic light-emitting diodes is preferably disposed between the cathode and the anode.

According to an advantageous aspect of the electronic device, the multilayer assembly comprises a low surface energy substrate, preferably adjacent to the pressure sensitive adhesive layer. According to another advantageous aspect of the electronic device, the pressure sensitive adhesive layer is adjacent to a metal electrode, in particular to any of the anode or the cathode. According to still another advantageous aspect of the electronic device, the pressure sensitive adhesive layer is adjacent to the optically clear substrate.

According to an exemplary aspect of the electronic device, the multilayer assembly comprises an electrically conductive metal layer (such as Copper, Gold, Silver, Aluminum), preferably adjacent to the pressure sensitive adhesive layer. According to another exemplary aspect of the electronic device, the multilayer assembly comprises an electrically conductive organic layer, preferably adjacent to the pressure sensitive adhesive layer.

According to still another exemplary aspect of the electronic device, the multilayer assembly comprises a semiconductive inorganic layer, preferably adjacent to the pressure sensitive adhesive layer. According to yet another exemplary aspect of the electronic device, the multilayer assembly comprises a semi-conductive organic layer, preferably adjacent to the pressure sensitive adhesive layer.

In a typical aspect of the electronic device according to the present disclosure, the multilayer assembly is an organic light-emitting device module.

According to a preferred execution of the present disclosure, the electronic device is selected from the group consisting of organic light-emitting diodes display panels, and touch-sensitive panels.

In another preferred execution, the electronic device of the present disclosure is integrated into an article selected from the group consisting of smartphones, mobile phones, tablet PCs, personal computers, notebook PCs, TV, digital cameras, car navigation systems, smartwatches, media players, activity trackers, hand held electronic devices, and any combinations thereof.

The present disclosure is further directed to a method of manufacturing an electronic device comprising at least one organic light-emitting diode, wherein the method comprises the step of using a pressure sensitive adhesive composition or a multilayer assembly as described above. In a particular aspect, this method comprises the step of applying a pressure sensitive adhesive composition as described above onto any of the metal electrodes, the low surface energy substrates or the optically clear substrates.

According to another aspect of the present disclosure, it is provided a method for encapsulating organic light-emitting devices or organic light-emitting diodes, wherein the method comprises the step of using a pressure sensitive adhesive composition or a multilayer assembly as described above.

The present disclosure is further directed to a method for protecting organic light-emitting devices or organic light-emitting diodes from moisture and air permeation, wherein the method comprises the step of using a pressure sensitive adhesive composition or a multilayer assembly as described above.

According to another aspect, the present disclosure is directed to the use of a pressure sensitive adhesive composition or a multilayer assembly as described above for protecting organic light-emitting devices or organic light-emitting diodes from moisture and air permeation.

According to still another aspect, the present disclosure is directed to the use of a pressure sensitive adhesive composition or a multilayer assembly as described above for encapsulating organic light-emitting devices or organic light-emitting diodes.

Item 1 is an electronic device comprising at least one organic light-emitting diode and a pressure sensitive adhesive composition comprising a synthetic rubber block (co)polymer, and wherein the pressure sensitive adhesive composition has:
- a) a relative permittivity no greater than 2.50, when measured at an alternating current frequency of 100 kHz according to the test method described in the experimental section;
- b) a water uptake no greater than 0.60 wt %, when measured after exposure to 60° C. and 95% relative humidity for 120 hours, according to the test method described in the experimental section; and
- c) optionally, a peel adhesion value above 0.20 N/mm, when measured at 85° C. according to the test method described in the experimental section.

Item 2 is an electronic device according to item 1, wherein the synthetic rubber block (co)polymer is a styrenic block (co)polymer.

Item 3 is an electronic device according to any of item 1 or 2, wherein the pressure sensitive adhesive composition comprises at least 20 wt %, at least 25 wt %, at least 30 wt %, at least 35 wt %, or even at least 40 wt % of synthetic rubber block (co)polymer(s), based on the weight of the pressure sensitive adhesive composition.

Item 4 is an electronic device according to any of the preceding items, wherein the pressure sensitive adhesive composition has a relative permittivity no greater than 2.45, no greater than 2.40, no greater than 2.35, no greater than 2.30, when measured at an alternating current frequency of 100 kHz according to the test method described in the experimental section.

Item 5 is an electronic device according to any of the preceding items, wherein the pressure sensitive adhesive composition has a relative permittivity no greater than 2.50, no greater than 2.45, or even no greater than 2.40, when measured at an alternating current frequency of 100 kHz after exposure to 65° C. and 90% relative humidity for 72 hours, according to the test method described in the experimental section.

Item 6 is an electronic device according to any of the preceding items, wherein the pressure sensitive adhesive composition has a relative permittivity no greater than 2.50, no greater than 2.45, or even no greater than 2.40, when measured at an alternating current frequency of 100 kHz after exposure to 65° C. and 90% relative humidity for 500 hours, according to the test method described in the experimental section.

Item 7 is an electronic device according to any of the preceding items, wherein the pressure sensitive adhesive composition has a water uptake no greater than 0.55 wt %, no greater than 0.50 wt %, no greater than 0.45 wt %, no greater than 0.40 wt %, no greater than 0.35 wt %, no greater than 0.30 wt %, no greater than 0.25 wt %, no greater than 0.20 wt %, or even no greater than 0.15 wt %, when measured after exposure to 60° C. and 95% relative humidity for 120 hours, according to the test method described in the experimental section.

Item 8 is an electronic device according to any of the preceding items, wherein the pressure sensitive adhesive composition has a peel adhesion value above 0.25 N/mm, above 0.30 N/mm, above 0.35 N/mm, above 0.40 N/mm, above 0.45 N/mm, above 0.50 N/mm, or even above 0.55 N/mm, when measured at 85° C. (on PET) according to the test method described in the experimental section.

Item 9 is an electronic device according to any of the preceding items, wherein the pressure sensitive adhesive composition comprises:
- a) a multi-arm block copolymer of the formula $Q_n$-Y, wherein:
  - (i) Q represents an arm of the multi-arm block copolymer and each arm independently has the formula G-R,
  - (ii) n represents the number of arms and is a whole number of at least 3, and
  - (iii) Y is the residue of a multifunctional coupling agent, wherein each R is a rubbery block comprising a polymerized conjugated diene, a hydrogenated derivative of a polymerized conjugated diene, or combinations thereof; and each G is a glassy block comprising a polymerized monovinyl aromatic monomer;
- b) a polymeric plasticizer having a weight average molecular weight $M_w$ comprised between 10,000 and 100,000 g/mol;
- c) at least one hydrocarbon tackifier which is primarily compatible with the rubbery blocks;
- d) a glassy block compatible aromatic resin having a softening point value (RBSP) of at least 150° C., when measured by the ring and ball test method described in the experimental section; and
- e) optionally, a linear block copolymer of the formula L-$(G)_m$, wherein L is a rubbery block comprising a polymerized olefin, a polymerized conjugated diene, a hydrogenated derivative of a polymerized conjugated diene, or any combinations thereof; and wherein m is 1 or 2.

Item 10 is an electronic device according to item 9, wherein the glassy block compatible aromatic resin has a weight average molecular weight $M_w$ of 30,000 g/mol or less, of 25,000 g/mol or less, of 20,000 g/mol or less, of 15,000 g/mol or less, or even of 10,000 g/mol or less.

Item 11 is an electronic device according to any of item 9 or 10, wherein the glassy block compatible aromatic resin has a softening point value (RBSP) of at least 155° C., at least 160° C., at least 165° C., at least 170° C., at least 180° C., at least 190° C. or even at least 200° C., when measured by the ring and ball test method described in the experimental section.

Item 12 is an electronic device according to any of items 9 to 11, wherein the glassy block compatible aromatic resin has a glass transition temperature (Tg) of at least 100° C., at least 110° C., at least 120° C., at least 130° C., at least 140° C., at least 150° C., or even at least 160° C.

Item 13 is an electronic device according to any of items 9 to 12, wherein the glassy block compatible aromatic resin has a weight average molecular weight $M_w$ of 10,000 g/mol or less, less than 8,000 g/mol, less than 6,000 g/mol, less than 4,000 g/mol, or even less than 2,000 g/mol.

Item 14 is an electronic device according to any of items 9 to 13, wherein the glassy block compatible aromatic resin has a weight average molecular weight $M_w$ of at least 1,000 g/mol, at least 2,000 g/mol, at least 3,000 g/mol, or even at least 4,000 g/mol.

Item 15 is an electronic device according to any of items 9 to 14, wherein the glassy block compatible aromatic resin has a weight average molecular weight $M_w$ comprised between 1,000 and 9,500 g/mol, or even between 2,000 and 9,000 g/mol.

Item 16 is an electronic device according to any of items 9 to 15, wherein the glassy block compatible aromatic resin is essentially a hydrocarbon aromatic resin.

Item 17 is an electronic device according to any of items 9 to 16, wherein the glassy block compatible aromatic resin is selected from the group consisting of hydrocarbon aromatic resins, arylene oxide resins, C9-based hydrocarbon aromatic resins, C9-based hydrogenated hydrocarbon aromatic resins, polyarylene oxide resins, in particular polyphenylene oxides or polyphenylene ethers, indene coumarone resins, aromatic resins based on copolymers of C9 with maleic anhydride, and any combinations or mixtures thereof.

Item 18 is an electronic device according to any of items 9 to 17, wherein the glassy block compatible aromatic resin is selected from the group consisting of hydrocarbon aromatic resins, arylene oxide resins, and any combinations thereof.

Item 19 is an electronic device according to any of items 9 to 18, wherein the glassy block compatible aromatic resin is selected from the group consisting of C9-based hydrocarbon aromatic resins, C9-based hydrogenated hydrocarbon aromatic resins, polyarylene oxide resins, in particular polyphenylene oxides or polyphenylene ethers.

Item 20 is an electronic device according to any of items 9 to 19, wherein the glassy block compatible aromatic resin is selected from the group of C9-based hydrocarbon aromatic resins.

Item 21 is an electronic device according to any of items 9 to 19, wherein the glassy block compatible aromatic resin is selected from the group of polyphenylene oxides or polyphenylene ethers.

Item 22 is an electronic device according to any of items 9 to 21, wherein the glassy block compatible aromatic resin has a Volatile Organic Compound (VOC) value of less than 1,000 ppm, less than 800 ppm, less than 600 ppm, less than 500 ppm, or even less than 400 ppm, when measured by thermogravimetric analysis according to the weight loss test methods described in the experimental section.

Item 23 is an electronic device according to any of items 9 to 22, wherein the glassy block compatible aromatic resin has a Volatile Fogging Compound (FOG) value of less than 1,500 ppm, less than 1,000 ppm, less than 800 ppm, less than 600 ppm, or even less than 500 ppm, when measured by thermogravimetric analysis according to the weight loss test methods described in the experimental section.

Item 24 is an electronic device according to any of items 9 to 23, wherein the polymeric plasticizer has a weight average molecular weight $M_w$ of less than 95,000 g/mol, less than 90,000 g/mol, less than 80,000 g/mol, less than 70,000 g/mol, less than 60,000 g/mol, less than 50,000 g/mol, or even less than 40,000 g/mol.

Item 25 is an electronic device according to any of items 9 to 24, wherein the polymeric plasticizer has a weight average molecular weight $M_w$ of at least 15,000 g/mol, at least 20,000 g/mol, or even at least 30,000 g/mol.

Item 26 is an electronic device according to any of items 9 to 25, wherein the polymeric plasticizer has a weight average molecular weight $M_w$ comprised between 10,000 and 80,000 g/mol, between 20,000 and 70,000 g/mol, between 25,000 and 65,000 g/mol, between 25,000 and 60,000 g/mol, between 30,000 and 60,000 g/mol, or even between 30,000 and 55,000 g/mol.

Item 27 is an electronic device according to any of items 9 to 26, wherein the polymeric plasticizer has a Volatile Organic Compound (VOC) value of less than 1,000 ppm, less than 800 ppm, less than 600 ppm, less than 400 ppm or even less than 200 ppm, when measured by thermogravimetric analysis according to the weight loss test methods described in the experimental section.

Item 28 is an electronic device according to any of items 9 to 27, wherein the polymeric plasticizer has a Volatile Fogging Compound (FOG) value of less than 2,500 ppm, less than 2,000 ppm, less than 1,500 ppm, less than 1,000 ppm, less than 800 ppm, less than 600 ppm, or even less than 500 ppm, when measured by thermogravimetric analysis according to the weight loss test method described in the experimental section Item 29 is an electronic device according to any of items 9 to 28, wherein the polymeric plasticizer is a polyisobutylene plasticizer.

Item 30 is an electronic device according to any of items 9 to 29, wherein the hydrocarbon tackifier which is primarily compatible with the rubbery blocks is selected from the group consisting of polymeric terpenes, hetero-functional terpenes, coumarone-indene resins, esters of rosin acids, disproportionated rosin acid esters, hydrogenated rosin acids, C5 aliphatic resins, C9 hydrogenated aromatic resins, C5/C9 aliphatic/aromatic resins, dicyclopentadiene resins, hydrogenated hydrocarbon resins arising from C5/C9 and dicyclopentadiene precursors, hydrogenated styrene monomer resins, and blends thereof.

Item 31 is an electronic device according to any of items 9 to 30, wherein the hydrocarbon tackifier which is primarily compatible with the rubbery blocks has a Volatile Organic Compound (VOC) value of less than 1,000 ppm, when measured by thermogravimetric analysis according to the weight loss test methods described in the experimental section.

Item 32 is an electronic device according to any of items 9 to 31, wherein the hydrocarbon tackifier which is primarily compatible with the rubbery blocks has a Volatile Organic Compound (VOC) value of less than 800 ppm, less than 600 ppm, less than 400 ppm or even less than 200 ppm, when measured by thermogravimetric analysis according to the weight loss test method described in the experimental section.

Item 33 is an electronic device according to any of items 9 to 32, wherein the hydrocarbon tackifier which is primarily compatible with the rubbery blocks has a Volatile Fogging Compound (FOG) value of less than 1,500 ppm, less than 1,000 ppm, less than 800 ppm, less than 600 ppm, or even less than 500 ppm, when measured by thermogravimetric analysis according to the weight loss test methods described in the experimental section.

Item 34 is an electronic device according to any of items 9 to 33, wherein the multi-arm block copolymer is a star block copolymer.

Item 35 is an electronic device according to any of items 9 to 34, wherein the multi-arm block copolymer is a polymodal, asymmetric star block copolymer.

Item 36 is an electronic device according to any of items 9 to 35, wherein at least one of the rubbery blocks of the multi-arm block copolymer comprises a conjugated diene selected from the group consisting of isoprene, butadiene, ethylene butadiene copolymers, and any combinations thereof, preferably wherein each of the rubbery blocks of the multi-arm block copolymer comprises a conjugated diene selected from the group consisting of isoprene, butadiene, ethylene butadiene copolymers, and any combinations thereof.

Item 37 is an electronic device according to any of items 9 to 36, wherein at least one of the rubbery blocks of the multi-arm block copolymer comprises a conjugated diene selected from the group consisting of isoprene, butadiene, and any combinations thereof, preferably wherein each of the rubbery blocks of the multi-arm block copolymer comprises a conjugated diene selected from the group consisting of isoprene, butadiene, and any combinations thereof.

Item 38 is an electronic device according to any of items 9 to 37, wherein at least one of the glassy blocks of the multi-arm block copolymer is a monovinyl aromatic monomer selected from the group consisting of styrene, styrene-compatible blends, and any combinations thereof, preferably wherein each of the glassy blocks of the multi-arm block copolymer is a monovinyl aromatic monomer selected from the group consisting of styrene, styrene-compatible blends, and any combinations thereof.

Item 39 is an electronic device according to any of claims 9 to 38, wherein at least one arm of the multi-arm block copolymer is selected from the group consisting of styrene-isoprene-styrene, styrene-butadiene-styrene, styrene-ethylene-butadiene-styrene, and combinations thereof, preferably wherein each arm of the multi-arm block copolymer is selected from the group consisting of styrene-isoprene-styrene, styrene-butadiene-styrene, styrene-ethylene-butadiene-styrene, and any combinations thereof.

Item 40 is an electronic device according to any of items 9 to 39, wherein at least one arm of the multi-arm block copolymer is a styrene-isoprene-styrene block copolymer, preferably wherein each arm of the multi-arm block copolymer is a styrene-isoprene-styrene block copolymer.

Item 41 is an electronic device according to any of items 9 to 40, wherein the number of arms of the multi-arm block copolymer, n, is a whole number from 3 to 15, from 4 to 15, from 6 to 15, or even from 8 to 15.

Item 42 is an electronic device according to any of items 9 to 41, wherein the rubbery block of the linear block copolymer comprises a conjugated diene selected from the group consisting of isoprene, butadiene, ethyl butadiene copolymers, and any combinations thereof.

Item 43 is an electronic device according to any of items 9 to 42, wherein the rubbery block of the linear block copolymer comprises a conjugated diene selected from the group consisting of isoprene, butadiene, and any combinations thereof.

Item 44 is an electronic device according to any of items 9 to 43, wherein at least one glassy block of the linear block copolymer is a mono vinyl aromatic monomer selected from the group consisting of styrene, styrene-compatible blends, and any combinations thereof.

Item 45 is an electronic device according to any of items 9 to 44, wherein the linear block copolymer comprises two glassy blocks.

Item 46 is an electronic device according to any of items 9 to 45, wherein the linear block copolymer is selected from the group consisting of styrene-isoprene-styrene, styrene-butadiene-styrene, styrene-ethylene-butadiene-styrene, and any combinations thereof.

Item 47 is an electronic device according to any of items 9 to 46, wherein the linear block copolymer is a styrene-isoprene-styrene block copolymer.

Item 48 is an electronic device according to any of items 9 to 47, wherein the total amount of the glassy block compatible aromatic resin is of no greater than 20 wt %, no greater than 18 wt %, no greater than 15 wt %, or even no greater than 12 wt %, expressed as a percent by weight based on the total weight of the pressure sensitive adhesive composition.

Item 49 is an electronic device according to any of items 9 to 48, wherein the total amount of the glassy block compatible aromatic resin is of no less than 2 wt %, no less than 4 wt %, or even no less than 5 wt %, expressed as a percent by weight based on the total weight of the pressure sensitive adhesive composition.

Item 50 is an electronic device according to any of items 9 to 49, wherein the total amount of glassy block compatible aromatic resin is comprised between 0.5 and 20 wt %, between 1 and 15 wt %, between 1 and 13 wt %, or even between 2 and 12 wt %, expressed as a percent by weight based on the total weight of the pressure sensitive adhesive composition.

Item 51 is an electronic device according to any of items 9 to 50, wherein the total amount of the polymeric plasticizer is of no greater than 20 wt %, no greater than 18 wt %, no greater than 15 wt %, or even no greater than 12 wt %, expressed as a percent by weight based on the total weight of the pressure sensitive adhesive composition.

Item 52 is an electronic device according to any of items 9 to 51, wherein the total amount of the polymeric plasticizer is of no less than 2 wt %, no less than 4 wt %, or even no less than 6 wt %, expressed as a percent by weight based on the total weight of the pressure sensitive adhesive composition.

Item 53 is an electronic device according to any of items 9 to 52, wherein the total amount of the polymeric plasticizer is comprised between 2 and 20 wt %, between 4 and 15 wt %, between 5 and 12 wt %, between 5 and 10 wt %, or even between 5 and 8 wt %, expressed as a percent by weight based on the total weight of the pressure sensitive adhesive composition.

Item 54 is an electronic device according to any of the preceding items, wherein the pressure sensitive adhesive composition comprises at least one filler material selected from the group consisting of expandable microspheres, glassbubbles, and any combinations or mixtures thereof.

Item 55 is an electronic device according to any of items 9 to 53, wherein the pressure sensitive adhesive composition comprises:
  a) from 20 wt % to 80 wt %, from 20 wt % to 70 wt %, from 25 wt % to 60 wt %, from 30 wt % to 60 wt %, or even from 35 wt % to 60 wt % of the multi-arm block copolymer, based on the weight of the pressure sensitive adhesive composition;
  b) from 20 wt % to 70 wt %, from 25 wt % to 60 wt %, or even from 25 wt % to 50 wt % of the hydrocarbon tackifier which is primarily compatible with the rubbery blocks, based on the weight of the pressure sensitive adhesive composition;
  c) from 2 wt % to 20 wt %, from 4 wt % to 15 wt %, from 5 wt % to 12 wt %, or even from 5 wt % to 10 wt % of a polymeric plasticizer, based on the weight of the pressure sensitive adhesive composition;
  d) from 0.5 to 35 wt %, from 1 to 30 wt %, from 2 to 25 wt %, or even from 5 to 25 wt % of the glassy block compatible aromatic resin, based on the weight of the pressure sensitive adhesive composition;
  e) optionally, from 20 wt % to 80 wt %, from 20 wt % to 70 wt %, from 25 wt % to 60 wt %, from 30 wt % to 60 wt %, or even from 35 wt % to 60 wt % of the linear block copolymer, based on the weight of the pressure sensitive adhesive composition; and f) optionally, from 2 wt % to 30 wt %, from 2 wt % to 20 wt %, or even from 2 wt % to 15 wt % of a filler material preferably selected from the group of expandable microspheres and glass bubbles, based on the weight of the pressure sensitive adhesive composition.

Item 56 is an electronic device according to any of the preceding items, wherein the pressure sensitive adhesive composition is non-crosslinked, in particular not crosslinked with actinic radiation, more in particular with e-beam or UV irradiation.

Item 57 is an electronic device according to any of the preceding items, wherein the pressure sensitive adhesive composition is free of any crosslinking additive, in particular free of multifunctional (meth)acrylate compounds.

Item 58 is an electronic device according to any of the preceding items, wherein the pressure sensitive adhesive composition is free of (meth)acrylate monomers and free of oligomers having (meth)acrylic functionalities.

Item 59 is an electronic device according to any of the preceding items, wherein the pressure sensitive adhesive composition is free of functionalized isobutylene (co)polymers, in particular free of isobutylene (co)polymers having (pendent) alkoxysilane groups.

Item 60 is an electronic device according to any of the preceding items, wherein the pressure sensitive adhesive composition is free of processing oil, in particular mineral (hydrocarbon) oil.

Item 61 is an electronic device according to any of the preceding items, wherein the pressure sensitive adhesive composition is a hot melt adhesive, preferably obtained by a hotmelt extrusion process, in particular an extrusion processing step selected from the group consisting of multi screw extrusion processing steps, planetary extrusion processing steps, and any combinations thereof.

Item 62 is an electronic device according to any of the preceding items, wherein the pressure sensitive adhesive composition is a solvent-based adhesive.

Item 63 is an electronic device according to any of the preceding items, wherein the pressure sensitive adhesive has a Volatile Organic Compound (VOC) value of less than 2,000 ppm, less than 1,500 ppm, less than 1,000 ppm, less than 800 ppm, less than 600 ppm, less than 500 ppm, less than 400 ppm, or even less than 300 ppm, when measured by thermogravimetric analysis according to the weight loss test method described in the experimental section.

Item 64 is an electronic device according to any of the preceding items, wherein the pressure sensitive adhesive composition has a Volatile Organic Compound (VOC) value of less than 2,000 ppm, less than 1,500 ppm, less than 1,000 ppm, less than 800 ppm, less than 600 ppm, less than 500 ppm, less than 400 ppm, or even less than 300 ppm, when measured by thermal desorption analysis according to test method VDA278.

Item 65 is an electronic device according to any of the preceding items, wherein the pressure sensitive adhesive composition has a Volatile Fogging Compound (FOG) value of less than 4,000 ppm, less than 3,000 ppm, less than 2,500 ppm, less than 2,000 ppm, less than 1,500 ppm, less than 1,000 ppm, less than 800 ppm, less than 600 ppm, less than 500 ppm, or even less than 400 ppm, when measured by thermogravimetric analysis according to the weight loss test method described in the experimental section.

Item 66 is an electronic device according to any of the preceding items, wherein the pressure sensitive adhesive composition has a Volatile Fogging Compound (FOG) value of less than 4,000 ppm, less than 3,000 ppm, less than 2,500 ppm, less than 2,000 ppm, less than 1,500 ppm, less than 1,000 ppm, less than 800 ppm, less than 600 ppm, less than 500 ppm, or even less than 400 ppm, when measured by thermal desorption analysis according to test method VDA278.

Item 67 is an electronic device according to any of the preceding items, wherein the pressure sensitive adhesive composition has a static shear strength value of more than 2,000 min, more than 4,000 min, more than 6,000 min, more than 8,000 min, or even more than 10,000 min, when measured at 70° C. according to the static shear test method described in the experimental section.

Item 68 is an electronic device according to any of the preceding items, wherein the pressure sensitive adhesive composition has a static shear strength value of more than 2,000 min, more than 4,000 min, more than 6,000 min, more than 8,000 min, or even more than 10,000 min, when measured at 90° C. according to the static shear test method described in the experimental section.

Item 69 is an electronic device according to any of the preceding items, wherein the pressure sensitive adhesive composition is in the form of a layer having a thickness comprised between 5 and 1,500 µm, between 5 and 1,000 µm, between 10 and 500 µm, between 10 and 300 µm, between 15 and 250 µm, between 15 and 100 µm, or even between 15 and 50 µm.

Item 70 is an electronic device according to any of the preceding items, wherein the pressure sensitive adhesive composition is in the form of a layer having a thickness comprised between 20 and 1,500 µm, between 20 and 1,000 µm, between 20 and 500 µm, between 30 and 400 µm, between 30 and 250 µm, between 40 and 200 µm, or even between 50 and 150 µm.

Item 71 is an electronic device according to any of the preceding items, wherein the pressure sensitive adhesive composition is in the form of a layer having a thickness comprised between 100 and 6,000 µm, between 200 and 4,000 µm, between 500 and 2,000 µm, or even between 800 and 1,500 µm.

Item 72 is an electronic device according to any of the preceding items, wherein the pressure sensitive adhesive composition takes the form of a multilayer pressure sensitive adhesive construction comprising a pressure sensitive adhesive composition as described in any of the preceding claims and a backing layer adjacent to the pressure sensitive adhesive layer.

Item 73 is an electronic device according to item 72, wherein the multilayer pressure sensitive adhesive construction comprises a backing layer having a first major surface and a second major surface; and a first pressure sensitive adhesive skin layer bonded to the first major surface, wherein the first pressure sensitive adhesive skin layer comprises a pressure sensitive adhesive composition as described in any of items 1 to 71.

Item 74 is an electronic device according to item 73, wherein the multilayer pressure sensitive adhesive construction further comprises a second pressure sensitive adhesive skin layer bonded to the second major surface.

Item 75 is an electronic device according to item 74, wherein the first pressure sensitive adhesive skin layer and the second pressure sensitive adhesive layer are the same adhesive.

Item 76 is an electronic device according to item 74, wherein the first pressure sensitive adhesive skin layer and the second pressure sensitive adhesive layer each independently comprises a pressure sensitive adhesive composition as described in any of items 1 to 71.

Item 77 is an electronic device according to any of items 74 to 76, wherein the multilayer pressure sensitive adhesive construction is in the form of a skin/core/skin multilayer pressure sensitive adhesive assembly, wherein the backing layer is the core layer of the multilayer pressure sensitive adhesive assembly.

Item 78 is an electronic device according to any of items 72 to 77, wherein the backing layer comprise a pressure sensitive adhesive composition according to any of items 1 to 71.

Item 79 is an electronic device according to any of items 72 to 78, wherein the backing layer is a foam backing.

Item 80 is an electronic device according to any of items 72 to 79, wherein the backing layer comprises a polymer base material selected from the group consisting of rubber-based elastomeric materials, polyacrylates, polyurethanes, polyolefins, polyamines, polyamides, polyesters, polyethers, polyisobutylene, polystyrenes, polyvinyls, polyvinylpyrrolidone, and any combinations, copolymers or mixtures thereof.

Item 81 is an electronic device according to any of item 80, wherein the backing layer comprises a polymer base material selected from the group consisting of rubber-based elastomeric materials.

Item 82 is an electronic device according to item 81, wherein the rubber-based elastomeric material is selected from the group consisting of natural rubbers, synthetic rubbers, thermoplastic elastomeric materials, non-thermoplastic elastomeric materials, thermoplastic hydrocarbon elastomeric materials, non-thermoplastic hydrocarbon elastomeric materials, and any combinations or mixtures thereof.

Item 83 is an electronic device according to any of item 81 or 82, wherein the rubber-based elastomeric material is selected from the group consisting of halogenated butyl rubbers, in particular bromobutyl rubbers and chlorobutyl rubbers; halogenated isobutylene-isoprene copolymers; bromo-isobutylene-isoprene copolymers; chloro-isobutylene-isoprene copolymers; block copolymers; olefinic block copolymers; butyl rubbers; synthetic polyisoprene; ethylene-octylene rubbers; ethylene-propylene rubbers; ethylene-propylene random copolymers; ethylene-propylene-diene monomer rubbers; polyisobutylenes; poly(alpha-olefin); ethylene-alpha-olefin copolymers; ethylene-alpha-olefin block copolymers; styrenic block copolymers; styrene-isoprene-styrene block copolymers; styrene-butadiene-styrene block copolymers; styrene-ethylene/butadiene-styrene block copolymers; styrene-ethylene/propylene-styrene block copolymers; styrene-butadiene random copolymers; olefinic polymers and copolymers; ethylene-propylene random copolymers; ethylene-propylene-diene terpolymers, and any combinations or mixtures thereof.

Item 84 is an electronic device according to any of items 81 to 83, wherein the rubber-based elastomeric material is selected from the group consisting of styrene-isoprene-styrene block copolymers, styrene-butadiene-styrene block copolymers, styrene-ethylene-butadiene-styrene block copolymers, and any combinations or mixtures thereof.

Item 85 is an electronic device according to item 84, wherein the rubber-based elastomeric material is selected from the group consisting of styrene-isoprene-styrene block copolymers, styrene-butadiene-styrene block copolymers, and any combinations or mixtures thereof.

Item 86 is an electronic device according to any of items 72 to 85, wherein the backing layer further comprises at least one filler material which is preferably selected from the group consisting of microspheres; expandable microspheres, preferably pentane filled expandable microspheres; gaseous cavities; glass beads; glass microspheres; glass bubbles and any combinations or mixtures thereof; more preferably from the group consisting of expandable microspheres, glass bubbles, and any combinations or mixtures thereof.

Item 87 is an electronic device according to item 86, wherein the at least one filler material is selected from the group consisting of expandable microspheres, glassbubbles, and any combinations or mixtures thereof.

Item 88 is an electronic device according to any of the preceding items, wherein the pressure sensitive adhesive composition is part of a multilayer assembly comprising at least one organic layer which comprises organic light-emitting diodes.

Item 89 is an electronic device according to item 88, wherein the multilayer assembly comprises an optically clear substrate, which is preferably selected from glass substrates, polymeric substrates, and any combinations thereof.

Item 90 is an electronic device according to any of item 88 or 89, wherein the multilayer assembly further comprises metal electrodes, in particular an anode (formed from an electrically conductive material such as indium tin oxide) and a cathode (formed from a low work function metal such as lithium, magnesium, indium, calcium or barium), wherein the at least one organic layer which comprises organic light-emitting diodes is preferably disposed between the cathode and the anode.

Item 91 is an electronic device according to any of items 88 to 90, wherein the multilayer assembly comprises a low surface energy substrate, preferably adjacent to the pressure sensitive adhesive layer.

Item 92 is an electronic device according to any of item 90 or 91, wherein the pressure sensitive adhesive layer is adjacent to a metal electrode, in particular to any of the anode or the cathode.

Item 93 is an electronic device according to any of items 89 or 92, wherein the pressure sensitive adhesive layer is adjacent to the optically clear substrate.

Item 94 is an electronic device according to any of items 88 to 93, wherein the multilayer assembly comprises an electrically conductive metal layer, preferably adjacent to the pressure sensitive adhesive layer.

Item 95 is an electronic device according to any of items 88 to 94, wherein the multilayer assembly comprises an electrically conductive organic layer, preferably adjacent to the pressure sensitive adhesive layer.

Item 96 is an electronic device according to any of items 88 to 95, wherein the multilayer assembly comprises a semi-conductive inorganic layer, preferably adjacent to the pressure sensitive adhesive layer.

Item 97 is an electronic device according to any of items 88 to 96, wherein the multilayer assembly comprises a semi-conductive organic layer, preferably adjacent to the pressure sensitive adhesive layer.

Item 98 is an electronic device according to any of items 88 to 97, wherein the multilayer assembly is an organic light-emitting device module.

Item 99 is an electronic device according to any of the preceding items, which is selected from the group consisting of organic light-emitting diodes display panels, and touch-sensitive panels.

Item 100 is an electronic device according to any of the preceding items, which is integrated into an article selected from the group consisting of smartphones, mobile phones, tablet PCs, personal computers, notebook PCs, TV, digital cameras, car navigation systems, smartwatches, media players, activity trackers, hand held electronic devices, and any combinations thereof.

Item 101 is a method of manufacturing an electronic device comprising at least one organic light-emitting diode, wherein the method comprises the step of using a pressure sensitive adhesive composition or a multilayer assembly as described in any of items 1 to 98.

Item 102 is a method according to item 101, which comprises the step of applying a pressure sensitive adhesive composition as described in any of items 89 to 98 onto any of the metal electrodes, the low surface energy substrates or the optically clear substrates.

Item 103 is a method for encapsulating organic light-emitting devices or organic light-emitting diodes, wherein the method comprises the step of using a pressure sensitive adhesive composition or a multilayer assembly as described in any of items 1 to 98.

Item 104 is a method for protecting organic light-emitting devices or organic light-emitting diodes from moisture and air permeation, wherein the method comprises the step of using a pressure sensitive adhesive composition or a multilayer assembly as described in any of items 1 to 98.

Item 105 is the use of a pressure sensitive adhesive composition or a multilayer assembly as described in any of items 1 to 98 for protecting organic light-emitting devices or organic light-emitting diodes from moisture and air permeation.

Item 106 is the use of a pressure sensitive adhesive composition or a multilayer assembly as described in any of items 1 to 98 for encapsulating organic light-emitting devices or organic light-emitting diodes.

EXAMPLES

The present disclosure is further illustrated by the following examples. These examples are merely for illustrative purposes only and are not meant to be limiting on the scope of the appended claims.

Test Methods Applied:
Relative Permittivity

The relative permittivity of the pressure sensitive adhesive compositions are measured using a broadband Novocontrol Dielectric Spectrometer according to Test Method ASTM D150, at an alternating current frequency of 100 kHz. The samples are laminated together to give thin sheets of thicknesses approximately 1 mm and diameters of 40 mm. Relative permittivity measurements are done on the freshly prepared pressure sensitive adhesive compositions, and after exposure to 65° C. and 90% relative humidity for 72 hours and for 500 hours.

Water Uptake

The water uptake (or water absorption) of the pressure sensitive adhesive compositions are measured on a Rubotherm GHP-150 gravimetric balance at 65° C. and 90% relative humidity, typically after exposure to these conditions for 120 hours. The Rubotherm GHP-150 is a high pressure gravimetric adsorption instrument capable of measuring adsorption and desorption isotherms with solid samples using a variety of gases or vapors. The balance has a 25 gram maximum capacity with a resolution of 10 µg. A maximum pressure of ~150 bars can be achieved and the vacuum system has a standard range down to 10-3 bar. For the most common experimental temperatures, control to within ±0.5° C. is achievable.

The pressure sensitive adhesive samples are placed on a piece of aluminum foil. The foil is then rolled and holes are poked into it so that vapor could access the sample from multiple entry points. The foil is then inserted into a wire mesh sample bucket. Approximately 0.7 g of sample is used for each experiment. After drying, the pressure sensitive adhesive samples are exposed to approximately 90% relative humidity water vapor and the weight uptake is measured. The samples are dried on the unit for approximately two hours under dynamic vacuum prior to experimentation.

180° Peel Test at 85° C. and 300 mm/min

The single layer pressure sensitive adhesive films are laminated prior to testing on a 50 µm thick PET backing (commercially available as Hostaphan RN 50). The hereby obtained pressure sensitive adhesive strips are cut out in the machine direction from the pressure sensitive adhesive film sample material to provide test strips with a width of 13 mm and a length >120 mm.

For test sample preparation the adhesive coated side of each PSA assembly strip is laminated, after the liner is removed, with its adhesive side down to a clean PET film (having a thickness of 50 µm) bonded to a stainless steel panel with 3M 467MP™ adhesive transfer tape (with a thickness of 50±2 µm), using a standard rubber test roller (weight 2 kg) at a speed of approximately 5 mm per second to obtain intimate contact between the adhesive mass and the surface. The contact area of the adhesive on the test panel is 25 mm by 13 mm, with the force applied normal to the 13 mm dimension.

After applying the pressure sensitive adhesive assembly strips to the test panel, the test samples are allowed to dwell for 24 hours at ambient room temperature (23±2° C., 50±5% relative humidity) prior to testing at 85° C.

For peel testing the test samples are in a first step clamped in the lower movable jaw of an Instron tensile testing machine (Model 5965, commercially available). The pressure sensitive adhesive film strips are folded back at an angle of 180° and their free ends grasped in the upper jaw of the tensile tester in a configuration commonly utilized for 180° measurements. The tensile tester is set at 300 mm per minute jaw separation rate. Test results are expressed in Newtons per mm (N/mm). The quoted peel values are the average of two 180° peel measurements.

Metal Foil Corrosion Test

The single layer pressure sensitive adhesive films are laminated prior to testing on a 50 µm thick PET backing (commercially available as Hostaphan RN 50). The hereby obtained pressure sensitive adhesive strips are cut out in the machine direction from the pressure sensitive adhesive film sample material to provide test strips with a width of approximately 70 mm and a length of approximately 140 mm. The pressure sensitive adhesive strips are then laminated to a copper foil having a slightly greater dimension, and placed in an oven at 65° C. and 90% relative humidity for 500 hours. Corrosion is visually assessed by visually observation of any color changes or other indication of corrosion.

90° Peel Test at 300 mm/min (according to FINAT Test Method No. 2, 8th Edition 2009)

The single layer pressure sensitive adhesive films are laminated prior to testing on a 50 µm thick PET backing (commercially available as Hostaphan RN 50). The hereby obtained pressure sensitive adhesive strips are cut out in the machine direction from the pressure sensitive adhesive film sample material to provide test strips with a width of 12.7 mm and a length >120 mm.

For test sample preparation the adhesive coated side of each PSA assembly strip is placed, after the liner is removed, with its adhesive side down on a clean test panel using light finger pressure. Next, the test samples are rolled twice with a standard FINAT test roller (weight 2 kg) at a speed of approximately 10 mm per second to obtain intimate contact between the adhesive mass and the surface. After applying the pressure sensitive adhesive assembly strips to the test panel, the test samples are allowed to dwell for 24 hours at ambient room temperature (23±2° C., 50±5% relative humidity) prior to testing.

For peel testing the test samples are in a first step clamped in the lower movable jaw of a Zwick tensile tester (Model Z020 commercially available from Zwick/Roell GmbH, Ulm, Germany). The pressure sensitive adhesive film strips are folded back at an angle of 90° and their free ends grasped in the upper jaw of the tensile tester in a configuration commonly utilized for 90° measurements. The tensile tester is set at 300 mm per minute jaw separation rate. Test results are expressed in Newtons per mm (N/mm). The quoted peel values are the average of two 90°-peel measurements.

Static Shear Test at 70° C. or 90° C. with 500 g (FINAT Test Method No. 8, 8th Edition 2009)

The test is carried out at 70° C. or 90° C. The pressure sensitive adhesive film is laminated on a 50 μm thick PET backing (commercially available as Hostaphan RN50). Test specimens are cut out of the sample material having a dimension of 13 mm by 175 mm. The liner is then removed and the adhesive strips are adhered onto Ceramic Clear 5 (CC5) plates with an overlap of 12.7×25.4 mm. A loop is prepared at the end of the test strip in order to hold the specified weight. Next, the test samples are rolled down four times with a standard FINAT test roller (weight 2 kg) at a speed of approximately 10 mm per second to obtain intimate contact between the adhesive mass and the surface. After applying the pressure sensitive adhesive assembly strips to the test panel, the test samples are allowed to dwell for 24 hours at ambient room temperature (23±2° C., 50±5% relative humidity) prior to testing.

Each sample is then placed into a vertical shear-stand (+2° disposition) at 70° C. or 90° C. provided with automatic time logging. After 10 minutes dwell time in the oven, a 500 g weight is hung into the loop. The time until failure is measured and recorded in minutes. Target value is 10,000 minutes. Two samples are measured for each construction. A recorded time of ">10000" indicates that the adhesive did not fail after 10,000 min.

Ring and Ball Test Method

The softening point value of the glassy block compatible aromatic resin is determined according to Test Method ASTM E28-14.

TGA Test Method

The TGA (Thermogravimetric Analysis) measurements are performed with a Q5000IR equipment from Texas Instruments. The samples are weighed in a platinum pan and placed with an auto sampler in the oven of the apparatus. The nitrogen flow through the oven is 25 mL/min, the nitrogen flow through the balance is 10 mL/min. The temperature is equilibrated at 30° C. and is held for 15 minutes. Then the temperature is increased to 90° C. with a ramp of 60° C./min. The 90° C. are then held for 30 minutes. In a next step, the temperature is increased to 120° C. with a ramp of 60° C./min. The 120° C. are held for 60 minutes. The weight losses during 30 minutes at 90° C. (VOC analysis) and during 60 minutes at 120° C. (FOG analysis) are recorded.

The test is then completed by increasing the temperature to 800° C. with a ramp of 10° C./min. Then, the temperature is equilibrated at 600° C., the oven is purged with air and the temperature is increased to 900° C. with a ramp of 10° C./min.

Thermal Desorption Analysis of Organic Emissions According to VDA Test Method 278

VDA method 278 is a test method used for the determination of organic emissions from non-metallic trim components used to manufacture the interior of motor vehicles (VDA stands for "Verband der Automobilindustrie", the German Association of Automobilists). The method classifies the emitted organic compounds into two groups:

VOC value—the sum of volatile and semi-volatile compounds up to $n-C_{25}$ and

FOG value—the sum of the semi-volatile and heavy compounds from $n-C_{14}$ to $n-C_{32}$ For measuring the VOC and FOG values, adhesive samples of 30±5 mg are weighed directly into empty glass sample tubes. The volatile and semi-volatile organic compounds are extracted from the samples into the gas stream and are then re-focused onto a secondary trap prior to injection into a GC for analysis. An automated thermal desorber (Markes International Ultra-UNITY system) is hereby used for the VDA 278 testing.

The test method comprises two extraction stages:

VOC analysis, which involves desorbing the sample at 90° C. for 30 minutes to extract VOC's up to $n-C_{25}$. This is followed by a semi-quantitative analysis of each compound as μg toluene equivalents per gram of sample.

FOG analysis, which involves desorbing the sample at 120° C. for 60 minutes to extract semi-volatile compounds ranging from $n-C_{14}$ to $n-C_{32}$. This is followed by semi-quantitative analysis of each compound as μg hexadecane equivalents per gram of sample.

The VOC values expressed are the average of two measurements per sample. The higher value of the measurements is indicated as the result, as described in the VDA278 test method. In order to determine the FOG value, the second sample is retained in the desorption tube after the VOC analysis and reheated to 120° C. for 60 minutes.

Shear Adhesion Failure Temperature (SAFT)

The sample preparation for SAFT tests is as described above for the static shear test at 70° C. or 90° C. The test specimen are hung in a programmable air forced oven and a weight of 500 g is hung into the loop. The starting temperature is 23° C. and the temperature is increased by 10° C. every hour until reaching 130° C. The temperature at which the weight falls is recorded.

Test Substrates Used for Testing:

The pressure sensitive adhesive assemblies according to the present disclosure are tested for their adhesive properties on following substrates:

PP: polypropylene plate (PP Aquarius from Aquarius plastics, Guildford, England; 150 mm×50 mm×2 mm), available from Rocholl GmbH, Aglatershausen, Germany.

LDPE: low density polyethylene plate, available from Rocholl GmbH, Aglatershausen, Germany.

PET: polyethylene terephtalate film, available from Mitsubishi Film GmbH, Wiesbaden, Germany, under the trade name Hostaphan™. For test measurements, the PET film may be adhered to a stainless steel panel using 3M 467MP™ transfer tape with a thickness of 50±2

µm. In all test cases, adhesion of the PET to the stainless steel panel is much greater than the adhesion of the test samples.

Prior to testing, the PET, PP and LDPE substrates are cleaned as follows:

The panels are cleaned first with a dry tissue applied with gentle force to remove any residuals/waxy compounds on the surface and then cleaned with a mixture of isopropyl alcohol:distilled water (1:1) and dried with a tissue.

The adhesive tests are further also carried out on the following automotive clear coat panels:

CeramiClear5 ("CC5") coated panels available from PPG Industries.

The upper automotive clear coat includes acrylic resins and polyesters used alone or with mixtures of copolymers comprising hydroxy- or glycidyl-functionalities or carbamatic acid residues (groups); or copolymers of acrylic acid and methacrylic acid esters with hydroxyl groups, free acid groups and further co-monomers (e.g. styrene). Panels are cut prior to 90° peel and shear testing to the requested dimension. Before testing, the automotive clear coat coated panels are cleaned with a 1:1 mixture of isopropylalcohol and distilled water. Test panels are then wiped dry with a paper tissue.

Raw Materials Used:

The raw materials and commercial adhesive tapes used are summarized in Table 1 below.

TABLE 1

| Name | Description | Supplier |
|---|---|---|
| Kraton D1340K | Polymodal asymmetric SIS star block copolymer. | Kraton polymers |
| Kraton D1119 | Linear triblock copolymer based on styrene and isoprene with a polystyrene content of 22%. | Kraton polymers |
| Kraton D1161 | Linear SIS (Styrene-Isoprene-Styrene) triblock copolymer (15% Styrene, 19% Diblock). | Kraton polymers |
| Kraton FG1924X | Linear triblock copolymer based on styrene and ethylene/butylene with a polystyrene content of 13%. | |
| Escorez 5615 | aliphatic/aromatic hydrocarbon tackifier, primarily compatible with the rubbery blocks. | ExxonMobil |
| Escorez 5340 | cycloaliphatic hydrocarbon tackifier, primarily compatible with the rubbery blocks. | ExxonMobil |
| Regalite R9100 | Partially hydrogenated resin. | Eastman |
| Regalite R1090 | Fully hydrogenated resin. | Eastman |
| Piccotac 1020E | Liquid aliphatic hydrocarbon resin. | Eastman |
| Endex 160 | glassy block compatible aromatic resin; RBSP of 160° C.; Tg of 105° C., and $M_w$ of 8600 g/mol. | Eastman |
| Novares T140M | glassy block compatible aromatic resin; RBSP of 140° C. | Rüttgers |
| Novares TN170 | glassy block compatible aromatic resin; RBSP of 170° C.; Tg of 120° C. | Rüttgers |
| Noryl SA90 | glassy block compatible aromatic resin; Tg of 135° C., and $M_w$ of 1700 g/mol. | Eastman |

TABLE 1-continued

| Name | Description | Supplier |
|---|---|---|
| Noryl SA120 | glassy block compatible aromatic resin; Tg of 165° C., and $M_w$ of 6300 g/mol. | Eastman |
| Nyplast 222B | Mineral Oil | Nynas |
| Glissopal 1000 | Polyisobutylene with $M_w$ of 1600 g/mol. | BASF |
| Glissopal V1500 | Polyisobutylene of $M_w$ of 4140 g/mol. | BASF |
| Oppanol B12N | Polyisobutylene of $M_w$ of 51000 g/mol. | BASF |
| Irganox 1010 | Antioxidant | BASF |

Preparation of Pressure Sensitive Adhesive Compositions ("PSAs"):

The raw materials as later indicated in Table 2 are weighed in a glass jar. 150 g of toluene is then added. The jar is covered with a metal lid and placed on rotating rolls. The mixture is then rolled for 2 days until all the components are dissolved.

The solutions are coated onto a siliconized liner using a knife coater. The wet film is approximately 90 µm thick. The toluene is allowed to evaporate from the film for 20 minutes at room temperature (23±2° C., 50±5% relative humidity) before the PSA coating is annealed for 3 minutes at 110° C. The dry adhesive coating is about 30 g/m². For the comparative examples C1, C2 and Examples 3 and 4, the wet film is approximately 300 µm thick resulting in a dry adhesive coating of about 90 g/m². For allowing adhesive testing, the pressure sensitive adhesive layers are laminated onto a PET backing (commercially available as Hostaphan RN 50) having a film thickness of 50 µm, resulting in a PSA tape comprising a PET backing.

The PSA tapes obtained from solvent coating are NOT subjected to any irradiation treatment to promote chemical crosslinking, such as e.g. e-beam crosslinked.

Examples of Pressure Sensitive Adhesive Compositions (Examples 1 to 6)

Pressure sensitive adhesive examples 1 to 4 are based on the combination of a star shaped SIS polymer Kraton D1340K, a suitable hydrocarbon tackifier which is primarily compatible with the rubbery blocks, a suitable glassy block compatible hydrocarbon aromatic resin, and Oppanol B12N (PIB) as the polymeric plasticizer. Examples 5 to 7 are based on the combination of a star shaped SIS polymer Kraton D1340K, a suitable linear SIS polymer, a suitable hydrocarbon tackifier which is primarily compatible with the rubbery blocks, a suitable glassy block compatible hydrocarbon aromatic resin, and Oppanol B12N (PIB) as the polymeric plasticizer. Comparative example C1 is based on a linear SIS polymer Kraton D1161 and lacks a multi-arm block copolymer. Comparative example C2 is based on Kraton D1340, a star shaped SIS polymer, but lacks a glassy block compatible hydrocarbon aromatic resin. Irganox 1010 is added as an antioxidant to all examples.

TABLE 2

| | C1 (parts) | C2 (parts) | Ex. 1 (parts) | Ex. 2 (parts) | Ex. 3 (parts) |
|---|---|---|---|---|---|
| D1340K | — | 45.5 | 45.5 | 45.5 | 45.5 |
| D1161 | 45.5 | — | — | — | — |
| KD1119 | — | — | — | — | — |

TABLE 2-continued

| | | | | | |
|---|---|---|---|---|---|
| FG 1924X | — | — | — | — | — |
| Oppanol B12N | 7.35 | 7.35 | 7.5 | 7.5 | 7.35 |
| Endex 160 | — | — | 7.5 | — | — |
| Novares T140M | — | — | — | — | — |
| Novares TN170 | 10.5 | — | — | — | — |
| SA90 | — | — | — | 7.5 | — |
| SA120 | — | — | — | — | 2.6 |
| Escorez 5340 | — | — | 36.5 | 36.5 | — |
| Escorez 5615 | 33.5 | 44 | — | — | 41.4 |
| Irganox 1010 | 1.35 | 1.35 | 1.35 | 1.35 | 1.35 |

| | Ex. 4 (parts) | Ex. 5 (parts) | Ex. 6 (parts) | Ex. 7 (parts) |
|---|---|---|---|---|
| D1340K | 45.5 | 31.85 | 31.85 | 31.5 |
| D1161 | — | — | — | — |
| KD1119 | — | 13.65 | 13.65 | — |
| FG 1924X | — | — | — | 14 |
| Oppanol B12N | 7.35 | 7.5 | 7.5 | 7.5 |
| Endex 160 | — | — | — | 10.5 |
| Novares T140M | — | 10.5 | 10.5 | — |
| Novares TN170 | — | — | — | — |
| SA90 | 2.6 | — | — | — |
| SA120 | — | — | — | — |
| Escorez 5340 | — | 33.5 | — | 33.5 |
| Escorez 5615 | 41.4 | — | 33.5 | — |
| Irganox 1010 | 1.35 | 1.35 | 1.35 | 1.35 |

Relative Permittivity Test Results at 100 kHz of Some Pressure Sensitive Adhesive Compositions

TABLE 3

| | Relative permittivity measured at 100 kHz | | |
|---|---|---|---|
| Sample | (freshly prepared) | (65° C.; 90% relative humidity for 72 hours) | (65° C.; 90% relative humidity for 500 hours) |
| Ex. 1 | 2.46 | 2.38 | 2.38 |
| Ex. 2 | 2.50 | n/d | n/d |
| Ex. 5 | 2.38 | 2.39 | 2.42 |
| Ex. 6 | 2.38 | n/d | n/d |
| Ex. 7 | 2.45 | n/d | n/d |
| C3 | 3.61 | n/d | n/d |

Comparative example C3 is an acrylic adhesive transfer tape having a thickness of 25 μm, and prepared according to the procedure described in U.S. Pat. No. 5,602,221 (Bennett et al.) for example C1.

Water Uptake Test Results of Some Pressure Sensitive Adhesive Compositions

TABLE 4

| Sample | Water uptake (65° C.; 90% relative humidity for 500 hours) expressed in wt % change |
|---|---|
| Ex. 1 | 0.14 |
| Ex. 2 | 0.20 |
| Ex. 5 | 0.17 |
| Ex. 7 | 0.07 |
| C3 | 0.72 |

Mechanical Test Results of Some Pressure Sensitive Adhesive Compositions
180° Peel Test Results at 85° C.

TABLE 5

| Sample | 180° Peel to PET at 85° C. (N/mm) |
|---|---|
| Ex. 1 | 0.57 |
| Ex. 2 | 0.52 |
| Ex. 5 | 0.49 |
| Ex. 6 | 0.46 |
| Ex. 7 | 0.40 |
| C3 | 0.31 |

90° Peel Test Results at Room Temperature (RT)

TABLE 6

| | 90° Peel (N/mm) | | |
|---|---|---|---|
| Sample | To CC5 | To PP | To LDPE |
| Ex. 3 | 1.12 | 1.02 | 1.05 |
| Ex. 4 | 1.53 | 1.20 | 1.14 |
| C1 | 0.49 | 0.35 | n/d |
| C2 | 1.46 | 10.9 | n/d |

Static Shear Test Results at 90° C. and SAFT Test

TABLE 7

| Sample | Static Shear at 90° on CC5 (min) | SAFT on CC5 (° C.) |
|---|---|---|
| Ex. 3 | >10000 | 120 |
| Ex. 4 | >10000 | 110 |
| C1 | 106 | 80 |
| C2 | 296 | 80 |

Metal Foil Corrosion Test

All pressure sensitive adhesive examples 1 to 7 were submitted to the metal foil corrosion test as detailed above. No color change or other indication of corrosion was observed on the copper foil.

Screening of Some Raw Materials with Regard to Low VOC

In order to screen the raw materials concerning their improved low VOC behavior is by TGA (thermogravimetric analysis) measurements, as previously described in the test method section. Results of the TGA measurements are found in Table 8 below, the values are an average of 2 measurements.

TABLE 8

| Raw Material | Weight loss 30 min at 90° C. (ppm) | Weight loss 60 min at 120° C. (ppm) |
|---|---|---|
| Kraton D1340 | 326 ± 76 | 234 ± 99 |
| Kraton D1161 | 669 ± 47 | 253 ± 101 |
| Regalite 9100 | 1353 ± 223 | 10905 ± 1325 |
| Regalite 1090 | 2409 ± 457 | 20792 ± 284 |
| Escorez 5615 | 258 ± 153 | 727 ± 180 |
| Novares TN170 | 348 | 1202 |
| Endex 160 | 362 | 1087 |
| Noryl SA90 | 894 | 723 |
| Noryl SA120 | 712 | 836 |
| Nyplast 222B | 1225 ± 231 | 16817 ± 1664 |
| Glissopal 1000 | 8730 ± 622 | 18363 ± 658 |
| Glissopal V1500 | 2310 ± 148 | 4419 ± 206 |
| Oppanol B12N | 285 ± 34 | 538 ± 25 |

The invention claimed is:
1. An electronic device comprising at least one organic light-emitting diode and a pressure sensitive adhesive composition comprising a synthetic rubber block (co)polymer, and wherein the pressure sensitive adhesive composition has:
 a) a relative permittivity no greater than 2.50, when measured at an alternating current frequency of 100 kHz according to the test method described in the experimental section;
 b) a water uptake no greater than 0.60 wt %, when measured after exposure to 60° C. and 95% relative humidity for 120 hours, according to the test method described in the experimental section; and
 c) optionally, a peel adhesion value above 0.20 N/mm, when measured at 85° C. according to the test method described in the experimental section;
wherein the pressure sensitive adhesive composition comprises:
 a) a multi-arm block copolymer of the formula $Q_n$-Y, wherein:
  (i) Q represents an arm of the multi-arm block copolymer and each arm independently has the formula G-R,
  (ii) n represents the number of arms and is a whole number of at least 3, and
  (iii) Y is the residue of a multifunctional coupling agent,
 wherein each R is a rubbery block comprising a polymerized conjugated diene, a hydrogenated derivative of a polymerized conjugated diene, or combinations thereof; and each G is a glassy block comprising a polymerized monovinyl aromatic monomer;
 b) a polymeric plasticizer having a weight average molecular weight Mw comprised between 10,000 and 100,000 g/mol;
 c) at least one hydrocarbon tackifier which is primarily compatible with the rubbery blocks;
 d) a glassy block compatible aromatic resin having a softening point value (RBSP) of at least 150° C., when measured by the ring and ball test method described in the experimental section; and
 e) optionally, a linear block copolymer of the formula L-$(G)_m$, wherein L is
 a rubbery block comprising a polymerized olefin, a polymerized conjugated diene, a hydrogenated derivative of a polymerized conjugated diene, or any combinations thereof; and wherein m is 1 or 2.

2. An electronic device according to claim 1, wherein the pressure sensitive adhesive composition has a relative permittivity no greater than 2.45, no greater than 2.40, no greater than 2.35, no greater than 2.30, when measured at an alternating current frequency of 100 kHz according to the test 20 method described in the experimental section.

3. An electronic device according to claim 1, wherein the pressure sensitive adhesive composition has a water uptake no greater than 0.55 wt %, no greater than 0.50 wt %, no greater than 0.45 wt %, no greater than 0.40 wt %, no greater than 0.35 wt %, no greater than 0.30 wt %, no greater than 0.25 25 wt %, no greater than 0.20 wt %, or even no greater than 0.15 wt %, when measured after exposure to 60° C. and 95% relative humidity for 120 hours, according to the test method described in the experimental section.

4. An electronic device according to claim 1, wherein the pressure sensitive 30 adhesive composition has a peel adhesion value above 0.25 N/mm, above 0.30 N/mm, above 0.35 N/mm, above 0.40 N/mm, above 0.45 N/mm, above 0.50 N/mm, or even above 0.55 N/mm, when measured at 85° C. according to the test method described in the experimental section.

5. An electronic device according to claim 1, wherein the glassy block compatible aromatic resin is selected from the group consisting of hydrocarbon aromatic resins, arylene oxide resins, and any combinations thereof.

6. An electronic device according to claim 1, wherein the polymeric plasticizer is a polyisobutylene plasticizer.

7. An electronic device according to claim 1, wherein at least one arm of the multi-arm block copolymer is selected from the group consisting of
 styrene-isoprene-styrene, styrene-butadiene-styrene, styrene-ethylene-butadiene-styrene, and combinations thereof, preferably wherein each arm of the multi-arm block copolymer is selected from the group consisting of styrene-isoprene-styrene, styrene-butadiene-styrene, styrene-ethylene-butadiene-styrene, and any combinations thereof.

8. An electronic device according to claim 1, wherein the pressure sensitive adhesive composition comprises:
 a) from 20 wt % to 80 wt %, from 20 wt % to 70 wt %, from 25 wt % to 60 wt %, from 30 wt % to 60 wt %, or even from 35 wt % to 60 wt % of the multi-arm block copolymer, based on the weight of the pressure sensitive adhesive composition;
 b) from 20 wt % to 70 wt %, from 25 wt % to 60 wt %, or even from 25 wt % to 50 wt % of the hydrocarbon tackifier which is primarily compatible with the rubbery blocks, based on the weight of the pressure sensitive adhesive composition;
 c) from 2 wt % to 20 wt %, from 4 wt % to 15 wt %, from 5 wt % to 12 wt %, or even from 5 wt % to 10 wt % of a polymeric plasticizer, based on the weight of the pressure sensitive adhesive composition;
 d) from 0.5 to 35 wt %, from 1 to 30 wt %, from 2 to 25 wt %, or even from 5 to 25 wt % of the glassy block compatible aromatic resin, based on the weight of the pressure sensitive adhesive composition;
 e) optionally, from 20 wt % to 80 wt %, from 20 wt % to 70 wt %, from 25 wt % to 60 wt %, from 30 wt % to 60 wt %, or even from 35 wt % to 60 wt % of the linear block copolymer, based on the weight of the pressure sensitive adhesive composition; and
 f) optionally, from 2 wt % to 30 wt %, from 2 wt % to 20 wt %, or even from 2 wt % to 15 wt % of a filler material preferably selected from the group of expandable microspheres and glass bubbles, based on the weight of the pressure sensitive adhesive composition.

9. An electronic device according to claim 1, wherein the pressure sensitive adhesive composition is non-crosslinked, in particular not crosslinked with actinic radiation, more in particular with e-beam or UV irradiation.

10. An electronic device according to claim 1, wherein the pressure sensitive adhesive composition is part of a multi-layer assembly comprising at least one organic layer which comprises organic light-emitting diodes.

11. An electronic device according to claim 10, wherein the multilayer assembly is an organic light-emitting device module.

12. An electronic device according to claim 1, which is selected from the group consisting of organic light-emitting diodes display panels, and touch-sensitive panels.

13. A method for protecting organic light-emitting devices or organic light-emitting diodes from moisture and air permeation, wherein the method comprises the step of using a pressure sensitive adhesive composition or a multilayer assembly as described in claim 1.

14. Use of a pressure sensitive adhesive composition or a multilayer assembly as described in claim 1 for encapsulating organic light-emitting devices or organic light-emitting diodes.

* * * * *

UNITED STATES PATENT AND TRADEMARK OFFICE
CERTIFICATE OF CORRECTION

PATENT NO. : 11,286,407 B2
APPLICATION NO. : 16/471595
DATED : March 29, 2022
INVENTOR(S) : McAllister et al.

Page 1 of 1

It is certified that error appears in the above-identified patent and that said Letters Patent is hereby corrected as shown below:

In the Claims

Column 45

Line 60, In Claim 3, delete "0.25 25 wt%" and insert -- 0.25 wt% --, therefor.

Line 65, In Claim 4, delete "pressure sensitive 30 adhesive" and insert -- pressure sensitive adhesive --, therefor.

Signed and Sealed this
Eighth Day of August, 2023

Katherine Kelly Vidal
*Director of the United States Patent and Trademark Office*